United States Patent [19]

Suzuki et al.

[11] Patent Number: 5,253,264
[45] Date of Patent: Oct. 12, 1993

[54] OPTICAL SEMICONDUCTOR DEVICE

[75] Inventors: Nobuo Suzuki, Tokyo; Yuzo Hirayama, Yokohama; Masaaki Onomura, Tokyo, all of Japan

[73] Assignee: Kabushiki Kaisha Toshiba, Kawasaki, Japan

[21] Appl. No.: 800,250

[22] Filed: Nov. 29, 1991

[30] Foreign Application Priority Data

Nov. 29, 1990 [JP] Japan ................................ 2-325208
Mar. 28, 1991 [JP] Japan ................................ 3-90007

[51] Int. Cl.$^5$ ............................................. H01S 3/19
[52] U.S. Cl. ............................................. 372/46; 372/45
[58] Field of Search ............................ 372/45, 46

[56] References Cited

U.S. PATENT DOCUMENTS 5,111,471 5/1992 Hattori ............................... 372/46

FOREIGN PATENT DOCUMENTS 0208209 1/1987 European Pat. Off. .

OTHER PUBLICATIONS

IEEE Journal of Quantum Electronics, vol. QE-22, No. 6, Jun. 1986, pp. 833-843, J. E. Bowers, et al., "High Speed InGaAsP Constricted-Mesa Lasers".
Journal of Lightwave Technology, vol. LT-5, No. 12, Dec. 1987, pp. 1778-1781, M. Fukuda, et al., "Suppression of Interface Degradation in InGaAsP/InP Buried Heterostructure Lasers".
IEEE Journal of Quantum Electronics, vol. 25, No. 6, Jun. 1989, pp. 1320-1323, Y. Hirayama, et al., "High-Speed 1.5 $\mu$m Self-Aligned Constricted Mesa DFB Lasers Grown Entirely by MOCVD".
Appl. Phys. Letter, vol. 57, No. 3, pp. 224-226, "High Power Output 1.48-1.51 $\mu$m Continuously Graded Index Separate Confinement Strained Quantum Well Lasers"; T. Tanbun-Ek et al; Jul. 16, 1990.

Primary Examiner—James W. Davie
Attorney, Agent, or Firm—Oblon, Spivak, McClelland, Maier & Neustadt

[57] ABSTRACT

A semiconductor laser of multiple quantum well structure includes a multiple quantum well active layer having a well layer of $In_xGa_{1-x}As$ ($0 < x \leq 1$), a first p-type clad layer which is formed on the active layer and lattice-matches with InP, and a second p-type clad layer having a higher acceptor concentration than the first p-type clad layer. The acceptor concentration of the first p-type clad layer is set to be not more than $2 \times 10^{17}$ cm$^{-3}$ and that of the second p-type region is set to be not less than $1 \times 10^{18}$ cm$\times 3$ in the range of 0.25 $\mu$m from the active layer. The well layer of the active layer is formed of $In_xGa_{1-x}As$ ($0.53 < x \leq 1$). A laser in which the efficiency of injection into the active layer is increased and which has a small threshold value and excellent high-speed characteristic can be provided.

20 Claims, 17 Drawing Sheets

OPTICAL SEMICONDUCTOR DEVICE

BACKGROUND OF THE INVENTION

1. Field of the Invention

This invention relates to an optical semiconductor device having a buried quantum well structure, and more particularly to an optical semiconductor device designed for improving the characteristic of a laser of a multiple quantum well structure or the like.

2. Description of the Related Art

In recent years, a so-called quantum well semiconductor laser having at least one quantum well structure obtained by forming a well layer of a film thickness less than the de Broglie wavelength of electrons in an active layer and barrier layers whose forbidden band width is larger than that of the well layer and which are disposed on both sides of the well layer has been developed. The quantum well semiconductor laser has various advantages over a semiconductor laser of a double hetero structure having no quantum well formed in the active layer in that the oscillation threshold value can be lowered, the modulation bandwidth can be widened, the oscillation spectrum width can be narrowed, the temperature characteristic can be improved, and a high output power can be obtained, for example.

Further, recently, the degree of freedom of the oscillated wavelength may be enhanced and the characteristic may be further improved by using material which does not lattice-match with the substrate to form the quantum well layer. In general, if a material which does not lattice-match with the substrate exists near the active layer, a large number of lattice defects occur and the reliability and characteristic of the laser may be significantly deteriorated. However, even when a material which does not lattice-match with the substrate is used in the quantum well layer, the layer may be elastically strained so as not to generate lattice defects which may deteriorate the reliability and characteristic of the laser if the thickness of the layer is smaller than a critical thickness The result of calculations obtained by use of a model of Matthews and Blakeslee may be used as one measure of the critical thickness A high power laser and a laser with an extremely small threshold value are realized by use of an InGaAs/AlGaAs semiconductor laser formed on a GaAs substrate of 0.98 $\mu$m bandwidth utilizing the above-described strained quantum well structure. Various possibilities of changing the TE/TM mode characteristic and changing the switching characteristic and absorption characteristic can be obtained by introducing a strained optical waveguide layer in an optical semiconductor device other than the semiconductor laser, for example, a semiconductor laser amplifier, optical switch and optical modulator In the case of an InGaAs/InGaAsp series semiconductor laser formed on the InP substrate mainly used in the optical fiber communication, a so-called buried heterostructure in which the right and left portions of the active layer are filled with material having a larger forbidden bandwidth than the active layer is frequently used in order to obtain the single lateral mode oscillation of small threshold value. In this case, the strained quantum well layer comes to have a strained hetero interface on the side surface thereof and a large strain and stress are generated.

Now, a laser of $In_{0.7}Ga_{0.3}As$ strained quantum well structure formed on a (001) InP substrate 1 shown in FIGS. 23A and 23B is explained in detail as an example. The semiconductor laser is constructed by forming a multi-layered structure of an active layer (optical waveguide layer) 4 of strained quantum well structure, p-type InP clad layer 5 of 1.5 $\mu$m thickness and p-type InGaAsP (composition corresponding to a photoluminescence wavelength of 1.2 $\mu$m (1.2 $\mu$m-wavelength composition)) contact layer 6 of 0.8 $\mu$m thickness on the n-type InP substrate 1 (which is also used as a clad layer) and burying the laminated structure in an Fe-doped semi-insulative InP layer 7. The active layer 4 has undoped $In_{0.7}Ga_{0.3}As$ well layers 2 of 4.2 nm thickness and undoped InGaAsP (1.2 $\mu$m-wavelength composition) barrier layers 3 which lattice-match with InP and are respectively disposed on both sides of a corresponding one of the well layers.

The barrier layers 3 are formed with a thickness of 12 nm between the well layers 2 and a thickness of 20 nm on each of the uppermost and lowermost well layers and thus have a total thickness of 76 nm. Therefore, the total thickness of the active layer 4 is 92.8 nm. Further, the width of the buried active layer 4 is 2 $\mu$m. Electrodes 11 and 12 for current supply are formed on opposite sides of the substrate. Further, a laser resonator (optical cavity) with a length of 1 mm is formed by cleavage.

The lattice constant of the InP substrate is 0.58688 nm and the lattice constant of $In_{0.7}Ga_{0.3}As$ is 0.59381 nm. Assuming now that there is an infinite plane having no side surface, the well layer 2 is elastically strained since it is as thin as 4.2 nm. The degree of strain is $\epsilon_{xx} = \epsilon_{yy} = -0.01167$, $\epsilon_{zz} = -2(C_{12}/C_{11})\times\epsilon_{xx} = 0.011974$, $\epsilon_{yz} = \epsilon_{zx} = \epsilon_{xy} = 0$. $C_{12}/C_{11} = 0.504$ is the Poison's ratio of $In_{0.7}Ga_{0.3}As$. As a result, the lattice constant of the strained $In_{0.7}Ga_{0.3}As$ well layer 2 becomes equal to that of InP in the xy plane and the lattice constant in the z direction is 0.60092 nm.

However, in practice, the active layer 4 is buried in the Fe-doped InP blocking layer 7 in a stripe form with a width of 2 $\mu$m. As a result, lattice-mismatching occurs in the boundary between the well layer 2 and the blocking layer 7. Since the thickness of the well layer 2 is 4.2 nm, it may be formed of approx. 6.99 unit layers on average. In the face-centered cubic zinc blende structure, four atomic layers are present in the lattice interval a with a positional deviation in the <001> direction, and in this case, four layers (lattice constant a) which are aligned with each other are counted as one unit lattice layer.

When the thickness is divided by the lattice constant of InP, 7.16 unit lattice layers can be obtained. The well layer 2 has four layers and therefore lattice-mismatching corresponding to the 0.68 unit lattice layer will occur in the side surface of the active layer 4. Since the width of the active layer 4 is as large as 2 $\mu$m, the entire portion of the active layer 4 will not be elastically compressed. As a result, lattice defects such as dislocations may tend to occur near the side surface of the active layer 4.

Since the degree of lattice-mismatching of the upper side surface of the strained quantum well layer is larger than the 0.5 unit lattice layer, the lattice plane of the strained quantum well layer becomes nearer to a lattice plane of the blocking layer lying directly above the strained quantum well layer and will be more easily connected to the lattice plane on the side surface thereof, and the possibility of occurrence of dislocations becomes high. With such lattice defects, segregation of impurity tends to occur. Further, with such lattice defects, significant reduction in the reliability and deterioration in the laser characteristic such as reduction in the light emission efficiency rise in the oscillation threshold value and reduction in the differential gain may occur.

In an optical semiconductor device other than an semiconductor laser, defects due to the lattice-mismatching occur in the side surface of the buried strained quantum well optical waveguide layer to cause various demerits. For example, in a buried strained quantum well optical waveguide, an increase in the absorption coefficient and an increase in the light scattering coefficient may be caused by the defects. Further, in a light detection device having a buried strained quantum well light absorption layer, various problems such as an increase in a generation recombination dark current caused by the defects on the side surface, irregularity of the internal electric field caused by impurity segregated by the defects, reduction in the quantum efficiency due to recombination in the defects and reduction in the reliability may occur.

Further, in a semiconductor device other than the optical semiconductor device, a strained semiconductor layer such as a pseudomorphic HEMT strained channel layer or a strained In(Ga)As ohmic contact layer is used to improve the characteristic. When the strained semiconductor layer is buried in part of the substrate instead of the entire portion of the substrate, various problems such as reduction in the carrier lifetime, reduction in the electron mobility due to an increase in the scattering centers, an increase in noises, and reduction in the reliability which are caused by segregation of impurity and lattice defects due to the lattice-mismatching on the side surface may occur.

In a quantum well laser having InGaAsP or InGaAs at the well layer widely used in the optical communication field, the well barrier of the conduction band is low and the well barrier of the valence band is high so that overflow of electrons to the barrier layer and optical waveguide layer may easily occur and the injection efficiency of holes into the well layer will become low. For this reason, the utilization efficiency of carriers becomes low and the effect of reduction in the oscillation threshold value and extension of the modulation bandwidth is not significant in comparison with a case of a bulk type double hetero semiconductor laser having the same oscillation wavelength.

Since the injection efficiency of holes into the well layer becomes low when stimulated emission becomes large and the number of carriers becomes insufficient, a difference in the hole density occurs between the wells and the gain saturation $\epsilon$ for light becomes large. This means that damping becomes large and the frequency bandwidth will not be extended irrespective of an increase in the differential gain caused by the effect of the quantum well. A high power laser may have a preferable characteristic when it is of long resonator and a large number of wells are used, but since the above problems are present, the number of wells cannot be fully increased in practice.

In general, since saturation of the gain G with respect to the carriers is significant in the quantum well laser, the differential gain becomes significantly deteriorated when the oscillation threshold carrier density becomes high. Therefore, reduction in the oscillation threshold value is important in view of the high-speed response characteristic. Since the oscillating condition can be expressed by $\Gamma G = \alpha$, the optical total loss $\alpha$ must be set to a small value to decrease the gain necessary for the oscillation in order to reduce the oscillation threshold value.

In a quantum well laser, particularly, in a strained quantum well laser having strains in the well layer, the waveguide loss of the active layer can be suppressed to an extremely small value, but the loss may become large when the acceptor density of a p-clad layer is high. Since the optical confinement coefficient $\Gamma$ of the quantum well laser is small, influence by absorption in the clad layer is extremely large. Therefore, in order to obtain a quantum well laser of low threshold value, it is necessary to reduce the acceptor density of the p-clad layer.

In this case, however, since a large band barrier is created in the hetero junction portion between the p-clad layer and the active layer, there occurs a problem that the injection efficiency of holes into the quantum well active layer is lowered. This means that it is difficult to form a quantum well laser which has a small threshold value and a high-speed response. In order to solve the problem of the barrier of the hetero interface, use of GRIN (graded index) is proposed, but in this case, precise control for the crystal growth becomes necessary and the process becomes complicated.

In addition, a problem that defects of dislocations tend to occur in the side surface of the active layer by the lattice-mismatching has occurred in the strained quantum well laser of buried structure. In particular, when a layer doped with a transition metal such as Fe is formed on the side surface, there occurs a possibility that composite defects of dislocations and the transition metal serving as an impurity deteriorate the laser characteristic.

Thus, in the conventional semiconductor device having the strained semiconductor layer of buried structure, defects such as lattice defects and impurity segregation caused by the lattice-mismatching of the side surface of the strained semiconductor layer may occur, thereby significantly deteriorating the characteristic and reliability.

Further, in the multiple quantum well laser of InGaAs or InGaAsP, the injection efficiency of holes into the well layer is low and a difference in the hole density tends to occur between the wells, thereby making it difficult to increase the number of wells. Further, it is difficult to realize a laser which has a small absorption loss and high injection efficiency of holes and reduction in the oscillation threshold value and the improvement of the high-speed response characteristic cannot be easily attained.

SUMMARY OF THE INVENTION

This invention has been made in view of the above problems and an object of this invention is to provide a semiconductor device of a buried strained quantum well structure having an excellent characteristic and reliability by alleviating the lattice-mismatching in the side surface of a strained semiconductor layer.

Another object of this invention is to provide a semiconductor device having a small threshold value and an excellent high-speed response characteristic and capable of enhancing the injection efficiency of carriers into a quantum well active layer.

This invention is roughly divided into the following two features. That is, the first feature is the alleviation of the lattice-mismatching in the side surface of the strained quantum well layer and the second feature is the improvement of the injection efficiency.

According to a first aspect of this invention, an optical semiconductor device is constructed to have a strained quantum well layer whose side surface is tapered with respect to the normal to the substrate at an angle of 45 degrees or more.

According to a second aspect of this invention, an optical semiconductor device is constructed by use of material having an average lattice constant lying between those of the substrate and the strained quantum well layer to form a portion of the semiconductor layer of a clad layer which extends in the right and left directions of the strained quantum well layer and lies in a plane parallel to the substrate. The average lattice constant indicates a value corresponding to the average of lattice constants obtained over a range of the multi-layered structure corresponding to the thickness of the active layer when the multi-layered structure is used for forming that portion of the semiconductor layer of the clad layer which extends in the right and left directions of the strained quantum well layer and lies in a plane parallel to the substrate.

According to a third aspect of this invention, an optical semiconductor device is constructed by use of a semiconductor layer of a tetragonal system having the c axis set in the direction of the normal to the substrate to form part of the semiconductor layer of the clad layer which extends in the right and left directions of the strained quantum well layer and lies in a plane parallel to the substrate and the lattice constant of the a axis thereof is set to be less than that of the semiconductor substrate.

In each of the above aspects, it is assumed that the stripe-form optical waveguide layer (corresponding to the active layer in the semiconductor laser and the light absorption layer in the optical detection device) is surrounded at the right, left, upper and lower portions thereof by the clad layer having a forbidden bandwidth larger than that of the barrier layer of the strained quantum well. Of course, the first aspect can be used together with the other two aspects.

The important factor of a fourth aspect of this invention is to alleviate the lattice-mismatching caused in the side surface of the strained semiconductor layer of the first region buried in the second region by forming a composition changing region whose lattice constant continuously varies and reduce the possibility of generation of dislocations.

In this case, the strained semiconductor layer indicates a semiconductor layer having strains elastically and intentionally introduced therein by laminating semiconductor layers of compositions which have different lattice constants and each of which has a film thickness less than the critical thickness and it is not assumed that the strains are inadvertently introduced by the incomplete composition control of crystal growth. In general, in the case of a semiconductor layer grown on the GaAs and InP substrate, the maximum value of strains inadvertently introduced by the incomplete composition control of crystal growth is 0.2% or less, and if a larger degree of lattice-mismatching has occurred, it can be considered that the strained semiconductor layer is intentionally formed.

In an optical semiconductor device using a buried optical waveguide having the strained semiconductor layer as a portion thereof, it can be considered that a portion in which the optical waveguide is formed is a first region and a buried portion adjacent to the side surface of the optical waveguide is a second region.

The composition changing region can be formed by diffusing impurities to activate the mutual diffusion of atoms in the boundary portion, for example. When one of the first and second regions is formed by selective growth, it can be formed by utilizing variation in the crystal composition according to the distance from a mask formed on the other region.

The important factor of a fifth aspect of this invention is to reduce the possibility of generation of dislocations by reducing the accumulated lattice-mismatching in the side surface of the buried strained semiconductor layer to less than half the unit lattice interval. In this case, as described before, the strained semiconductor layer indicates a semiconductor layer having strains elastically introduced therein by laminating semiconductor layers of composition having different lattice constants with the film thickness of each strained semiconductor layer set less than the critical thickness.

In the semiconductor device having a strained semiconductor layer buried in the first region, this invention is made to satisfy the following expression (1) for a given value n;

$$\text{absolute } \{Z2(n) - Z1(n)\} < \delta_{min}(n)/2 \tag{1}$$

where the lower main surface of the lowermost strained semiconductor layer is used as a reference lattice plane (z=0), the coordinate system Z is set in the upward direction along the normal thereof, the coordinate of an n-th unit lattice plane from the reference lattice plane of the first region is $Z1(n)$ when the first region is assumed to infinitely extend, the coordinate of an n-th unit lattice plane from the reference lattice plane of the second region is $Z2(n)$ when the second region adjacent to the first region is assumed to infinitely extend, and the smallest one of four values of "$Z2(n+1) - Z2(n)$", "$Z2(n) - Z2(n-1)$", "$Z1(n+1) - Z1(n)$" and "$Z1(n) - Z1(n-1)$" is $\delta_{min}(n)$. In this case, absolute{x-}indicates the absolute value of x. In other words, the maximum degree of accumulated lattice-mismatching in the boundary between the first and second regions is suppressed to a value less than half that of the unit lattice layer. In this case, the term "unit lattice layer" is defined as a period of the crystal structure in the Z direction. For example, in the case of a zinc blend structure, the lattice constant a comes to correspond to one unit lattice layer when the Z direction is set to the <001> direction and $3^{\frac{1}{2}}a$ comes to correspond to one unit lattice layer when the Z direction is set to the <111> direction. When the reference plane is not a low index plane, for example, when it is an off substrate, the theory as described above can be similarly applied by setting the normal of the nearest low index plane to the Z direction.

As one means for satisfying the expression (1), a method of laminating at least one first strained semiconductor layer having a larger lattice constant than the semiconductor substrate and at least one second strained semiconductor layer having a smaller lattice constant than the semiconductor substrate and canceling the accumlated lattice-mismatching of the side surface caused by one of the first and second strained semiconductor layer groups with the lattice-mismatching of the side surface caused by the other strained semiconductor layer group. This method is effective when the total thickness of one of the strained semiconductor layer groups becomes too large and the expression (1) cannot be satisfied only by use of the strained semiconductor layer group.

In some cases, m atomic planes of the same group of elements exist in one unit lattice in the Z direction. For example, if the reference lattice plane of $Z=0$ is a Group-III atomic plane in the (001) plane of III-V compound semiconductor of a zinc blend structure, m becomes 2 since a Group-III atomic plane exists in a/2. In the case of (110) plane, since Group-III atoms and Group-V atoms are present on the same plane, the same group atomic planes of $m=4$ exist in the unit lattice layer $2^{\frac{1}{2}}a$. In such a case, lateral deviation may occur and dislocations will be caused in different atomic planes of the same group in the unit lattice layer. At this time, it is preferable to satisfy the following expression (2) for a given value n.

$$\text{absolute } \{Z2(n) - Z1(n)\} < \delta_{min}(n)/(2m) \quad (2)$$

In an optical semiconductor device using a buried optical waveguide which is partly formed of a strained semiconductor layer, it can be considered that a portion in which the optical waveguide is formed is a first region and a buried portion adjacent to the optical waveguide is a second region.

In the case of a strained quantum wire or strained quantum box, it can be considered that a semiconductor region forming the strained quantum wire or strained quantum box is a first region and a semiconductor region forming the barrier of the side surface thereof is a second region. Of course, the above embodiments can be used in combination.

The important factor of a sixth aspect of this invention is to inject current via the side surface of a quantum well active layer in order to enhance the efficiency of injection into the quantum well active layer.

That is, in a semiconductor laser of this invention including a multiple quantum well active layer having a well layer formed of $In_xGa_{1-x}As$ and a first p-type clad which lattice-matches with InP formed in the main surface of the active layer, a second p-type clad layer having an acceptor concentration higher than the first p-type clad layer is formed on the side surface of the active layer.

More preferably, in this invention, the acceptor concentration of the first p-type clad layer is set to be less than $2 \times 10^{17}$ cm$^{-3}$ within a range of 0.25 $\mu$m from the active layer, the acceptor concentration of the second p-type clad layer is set to be larger than $1 \times 10^{18}$ cm$^{-3}$, and the well layer is formed of $In_xGa_{1-x}As$ ($0.53 < x \leq 1$).

According to ninth and tenth aspects of this invention, in an optical semiconductor device of a multiple quantum well structure having well layers whose original lattice constant is larger (or smaller) than the lattice constant of the semiconductor substrate and barrier layers whose original lattice constant is equal to or smaller (or larger) than the lattice constant of the semiconductor substrate, whose forbidden bandwidth is larger than that of the well layer and which are alternately laminated with the well layers, the forbidden band edge of the light (or heavy) hole band of the well layer is set to substantially coincide with the forbidden band edge of the light (or heavy) hole band of the barrier layer.

In the optical semiconductor device of the first aspect, since the lattice-mismatching of the side surface of the optical waveguide is distributed in the tapered plane, distortion of the lattice gradually occurs over the taper width so as to suppress occurrence of large strains and stresses. As a result, an optical semiconductor device in which lattice defects such as dislocations and segregation of impurity can be prevented and which has an excellent characteristic and high reliability can be attained.

In the optical semiconductor device of the second aspect, since the average lattice constant in a plane parallel to the substrate including the stripe-form optical waveguide layer takes a value between the lattice constant of the substrate and the lattice constant of the strained quantum well layer, the lattice-mismatching of the side surface of the optical waveguide layer can be alleviated. As a result, an optical semiconductor device in which lattice defects such as dislocations and segregation of impurity can be prevented and which has an excellent characteristic and high reliability can be attained.

In the optical semiconductor device of the third aspect, since the tetragonal system material (semiconductor of chalcopyrite structure) is used in a plane parallel to the substrate including the stripe-form optical waveguide layer and the lattice constant a of the tetragonal system material is set to be smaller than the lattice constant of the substrate. A value c/2 obtained by dividing the lattice constant of the semiconductor mixed crystal of chalcopyrite structure in the direction along the axis c by 2 is generally smaller than the lattice constant a in the direction of axis a. Therefore, if the thickness thereof is properly determined, the average lattice constants of the blocking layer and active layer in the direction of the normal to the substrate can be approximately matched to each other i the optical semiconductor device having a buried strained quantum well optical waveguide layer whose strained quantum well layer has a lattice constant smaller than that of the substrate. Thus, it becomes possible to alleviate the lattice-mismatching in the side surface of the optical waveguide layer without causing the lattice-mismatching with respect to the semiconductor substrate. As a result, an optical semiconductor device in which lattice defects such as dislocations and segregation of impurity can be prevented and which has an excellent characteristic and high reliability can be attained.

In the optical semiconductor device of the fourth aspect, the stress caused by the lattice-mismatching between the first and second regions is distributed in the entire portion of the composition changing region formed therebetween. Therefore, an optical semiconductor device in which generation of dislocations caused by concentration of stress on the boundary surface can be suppressed and whose characteristic and reliability will not be degraded by the dislocations can be attained.

In a case where impurity is doped into the second region with high impurity concentration, mutual diffusion of host atoms in the diffusion regions can be activated if impurity diffusion from the boundary portion into the first region has occurred. As a result, in the boundary portion between the first and second regions, the mutual diffusion of host atoms between the regions proceeds while the strained quantum well is being disordered, thus forming a composition changing region.

When the semiconductor mixed crystal is subjected to the selective growth, the composition, film thickness and distortion amount of the mixed crystal depend on the distance from the mask and the opening ratio thereof. Based on this fact, a region having varying lattice constants can be formed in the boundary portion. The above composition changing region can be formed by setting the varying direction of the lattice constant from one region to the other region such that the lattice constant at a portion closer to the other region will become nearer to the average lattice constant of the other region In the fifth aspect, if the maximum degree of accumlated lattice-mismatching of the boundary portion between the first and second regions is suppressed to a value less than ½ of that of the unit lattice layer to satisfy the expression (1), generation of dislocations in the boundary between the first and second regions can be efficiently suppressed since the n'th unit lattice plane in the second region is located at a shorter distance from the n'th unit lattice plane in the first region than the $(n\pm1)$'th unit lattice plane in the second region.

It is possible to increase the film thickness and the number of layers of the strained semiconductor layer which satisfies the expression (1) by laminating at least one first strained semiconductor layer having a larger lattice constant than the semiconductor substrate and at least one second strained semiconductor layer having a smaller lattice constant than the semiconductor substrate and canceling the lattice-mismatching of the side surface caused by one of the first and second strained semiconductor layer groups with the lattice-mismatching of the side surface caused by the other strained semiconductor layer group.

If m atomic planes of the same group of elements exist in one unit lattice in the Z direction, an atomic plane of the same group of the adjacent region which is not deviated can be set at a shorter distance than an atomic plane of the same group of the adjacent region which is deviated by one to satisfy the expression (2). Generation of dislocations in the atomic planes of the same group accompanied by lateral deviation can be efficiently prevented since the maximum degree of accumlated lattice-mismatching in the Z direction of the boundary between the first and second regions is suppressed to a value less than ½ of the interval of the same group atomic planes.

In either case, an optical semiconductor device in which generation of lattice defects such as dislocations in a portion near the boundary between the first and second regions can be prevented and which has an excellent characteristic and high reliability can be attained.

According to sixth to eighth aspects of this invention, hole injection is effected mainly via the side surface of the quantum well active layer. Since the second p-type clad layer of the side surface of the active layer is formed in direct contact with each of the well layers and barrier layer, the injection efficiency of holes from the second p-type clad layer into the well layer directly or via the barrier layer becomes high and variation in the hole density between the well layers can be suppressed. This effect can be made significant when the hole concentration of the second p-type clad layer is set to be higher than $1\times10^{18}$ cm$^{-3}$. Therefore, an increase in the differential gain by the improvement of the injection efficiency, reduction in the threshold value, suppression of the gain saturation for light and high-speed response can be attained. Further, the number of quantum wells can be increased without lowering the performance, thereby effectively attaining a high output power.

The light absorption by the first p-type clad layer can be suppressed by setting the acceptor concentration of the first p-type clad layer to a value less than $2\times10^{17}$ cm$^{-3}$ in the range of 0.25 μm from the active layer, and thus the threshold value can be further reduced. Since the differential gain tends to decrease with carrier density, the reguction in the threshold value enhances the differential gain. This effect can be made significant in an $In_xGa_{1-x}As$ ($0.53<x\leqq1$) strained multiple quantum well semiconductor laser, in which intra-valence band absorption is small.

According to the ninth (or tenth) aspect, a multiple quantum well is formed for heavy (or light) holes, but substantially no quantum well is formed for light (or heavy) holes and respective wells are coupled by means of light (or heavy) holes so that the injection of holes into a well layer located at a far distance from the p-type clad layer can be efficiently effected. As a result, the characteristic can be improved by increasing the number of wells.

According to this invention, since the lattice-mismatching in the side surface of the buried strained semiconductor layer can be alleviated, an optical semiconductor device in which generation of segregation of impurity and lattice defects in portions near the side surface of the strained semiconductor layer can be prevented and which has an excellent characteristic and high reliability can be attained.

Further, according to this invention, an optical semiconductor device in which the efficiency of carrier injection into the quantum well active layer can be enhanced and which has a small threshould value and high-speed response can be attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described an embodiment of this invention with reference to the accompanying drawings.

First, the first and second embodiments are explained.

Figure 1B:
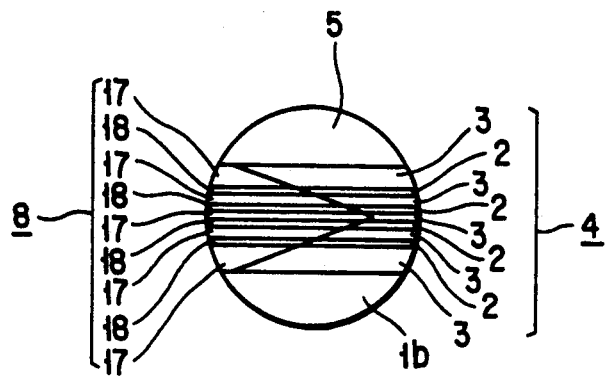
FIGS. 1A and 1B are cross sectional views showing the schematic structure of a semiconductor laser according to a first embodiment of this invention.
Figure 1A:
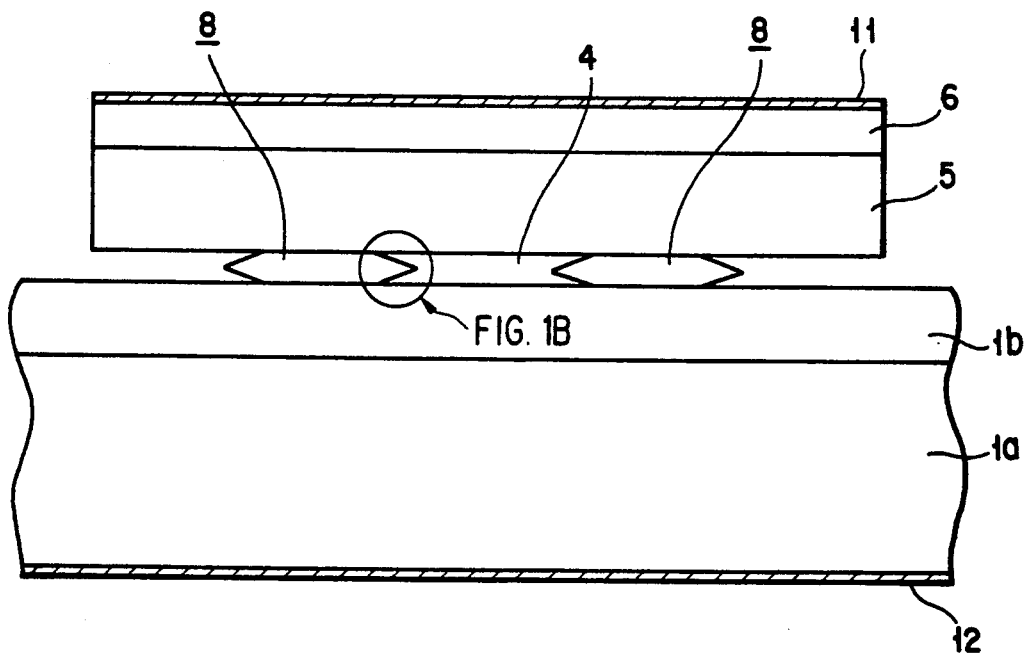

FIGS. 1A and 1B are cross sectional views showing the schematic structure of a semiconductor laser according to the first embodiment of this invention. An n-type InP buffer layer (clad layer) $1b$ is formed on an n-type InP substrate $1a$. A multiple quantum well active layer 4 having InGaAs strained quantum well layers 2 and InGaAsP barrier layers 3 alternately laminated is formed in a stripe form on the buffer layer $1b$. A blocking layer 8 having p-type InAlAs layers 18 and p-type InP layers 17 alternately laminated is formed on the side surface of the active layer 4. A p-type InP clad layer 5 is formed on the active layer 4 and the blocking layer 8 and a p-type InGaAsP contact layer 6 is formed on the clad layer 5. A p-side electrode 11 is formed on the contact layer 6 and an n-side electrode 12 is formed on the rear surface of the substrate $1a$.

Figure 2A:
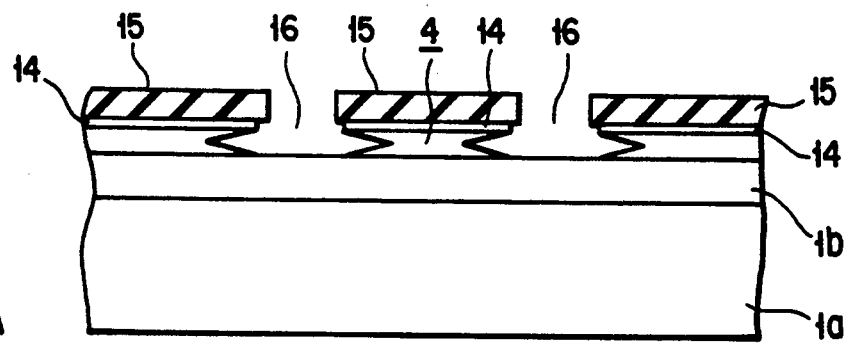
FIGS. 2A to 2C are cross sectional views showing a process of manufacturing the laser according to the first embodiment.

The semiconductor laser is manufactured as follows. First, as shown in FIG. 2A, an n-type InP buffer layer $1b$ of a thickness of 2 μm is formed on an n-type InP semiconductor substrate $1a$ having a (001) main surface by a metal organic chemical vapor deposition (MOCVD) method. Then an undoped InGaAs/InGaAsP multiple quantum well active layer 4 is formed on the buffer layer $1b$ and a thin undoped InP dummy layer 14 of 10 nm thickness is formed on the active layer 4. The active layer 4 is formed by alternately laminating four undoped $In_{0.7}Ga_{0.3}As$ strained quantum well layers 2 of 4.2 nm thickness and five undoped InGaAsP (1.2 μm-wavelength composition) barrier layers 3 of 12 nm thickness (20 nm on both ends), which lattice-match with InP.

An $SiO_2$ film 15 is deposited on the laminated structure and patterned by a conventional PEP technique so as to etch out both end portions of each stripe of 2 μm width serving as an active layer by 1 μm width. At this time, hydrochloric-series etchant is used to etch the thin InP dummy layer 14 and SH series (mixture of sulfuric acid, hydrogen peroxide liquid and water) is used as etchant for etching the active layer 4. A photoresist is removed after the process of etching the $SiO_2$ film 15. The cross section of an active layer having a recess at the center thereof as shown in FIG. 2A can be obtained by the SH series etching using the $SiO_2$ film 15 and InP dummy layer 14 as a mask. The width of the tapered portion on each side is 0.4 μm and the width of the active layer at the central portion is 1 μm.

Figure 2B:
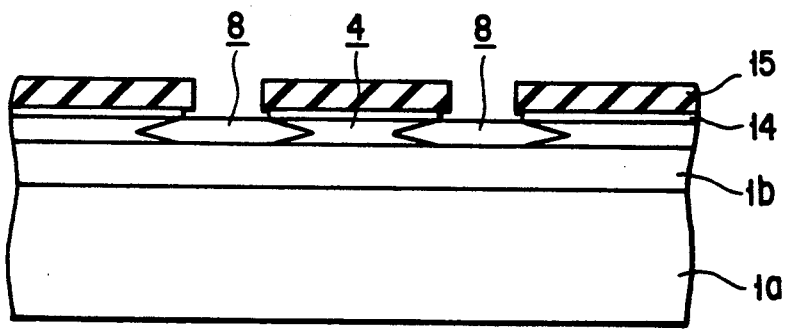

Next, as shown in FIG. 2B, strained blocking layers 8 are grown on both side portions 16 of the active layer 4 by the MOCVD method without removing the $SiO_2$ film 15. The strained blocking layer 8 is formed by alternately laminating four p-type $In_{0.7}Al_{0.3}As$ layers 18 of 4.2 nm thickness and five p-type InP layers 17 of 12 nm thickness (but the lowermost and upermost layers are 20 nm thick) and the total thickness thereof is substantially the same as that of the active layer (92.8 nm).

Figure 2C:
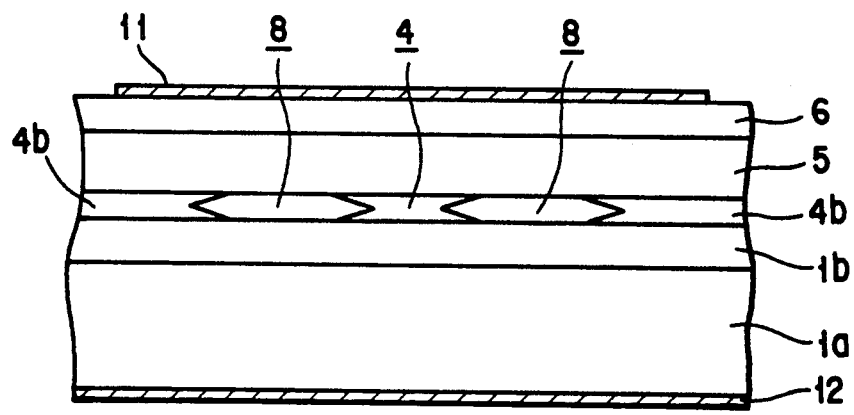

After this, as shown in FIG. 2C, the $SiO_2$ film 15 is removed, and a p-type InP clad layer 5 of 2 μm thickness and a p-type InGaAsP contact layer 6 of 0.8 μm thickness are sequentially grown on the resultant structure by the MOCVD method. Then, a p-type ohmic electrode (Ti/Pt/Au) 11 is formed on the contact layer 6 and an n-type ohmic electrode (Au/Ge) 12 is formed on the rear surface of the substrate 1.

Next, the contact layer 6 and p-type clad layer 5 are selectively etched to form a mesa structure of 10 μm width including the active layer 4. Further, the outside portion of the active layer $4b$ is removed by use of SH series etchant to form a semiconductor laser wafer of self aligned constricted mesa (SACM) structure having a cross section of mushroom form as shown in FIGS. 1A and 1B. The wafer is cleaved into a bar form of 1 mm length, then cut into chips of 300 μm width and mounted on a module (not shown). The oscillation wavelength is approx. 1.55 μm.

In the above structure, the $In_{0.7}Al_{0.3}As$ layer 18 and the InP layer 17 have a forbidden bandwidth larger than the active layer 4. The $In_{0.7}Al_{0.3}As$ layer 18 has substantially the same lattice constant as the $In_{0.7}Ga_{0.3}As$ strained quantum well layer 2. Therefore, the blocking layer 8 has a structure having substantially the same lattice constant as the active layer 4 and the average lattice constant (0.58813 nm) thereof takes a value between those of the InP substrate 1 and the $In_{0.7}Ga_{0.3}As$ strained quantum well layer 2. It is ideal to completely align the positions of the strained quantum well layer 2 and the $In_{0.7}Al_{0.3}As$ layer 18, but positional difference caused by the crystal growth may occur. However, since the active layer 4 is formed with a tapered side surface, influence by the lattice-mismatching may be distributed on the tapered portion, thus preventing generation of extremely large strain and stress even if position difference occurs between the strained quantum well layer 2 and the $In_{0.7}Al_{0.3}As$ layer 18. Therefore, a strained quantum well laser of buried structure in which segregation of impurity and lattice defects such as dislocations can be prevented and whose characteristic and reliability will not be degraded can be realized.

With the above structure, an excellent characteristic of the strained quantum well of the linewidth enhancement factor ($\alpha$ parameter) as small as 2 can be stably obtained, and as a result, a semiconductor laser having an excellent characteristic that the chirping ($-20$ dB average spectrum width) at the time of 10 Gb/s modulation (bias of the threshold value, modulation pulse current 40 $mA_{pp}$) is less than 0.3 nm can be realized. Further, with the semiconductor laser of this invention having the high reliability and small chirping, a several hundred km optical fiber transmission system of 10 Gb/s direct intensity modulation-direct detection system having no external optical modulator can be put into practice.

In a modification of the above embodiment, the blocking layer 8 may be formed of a single layer of $In_{0.667}Al_{0.333}As$ instead of using the laminated structure. In this case, the average lattice constants (0.58813 nm) of the active layer 4 and the blocking layer 8 are substantially equal to each other and the value thereof lies between the lattice constants of the substrate and the $In_{0.7}Ga_{0.3}As$ strained quantum well layer 2. The microscopic lattice-mismatching occurs in the side surface of the active layer 4, but since the side surface of the active layer is formed in a tapered form, the strain and stress are dispersed in the tapered portion and the segregation of impurity and lattice defects can be prevented in the same manner as in the former example. Further, even though the average lattice constants of the active layer 4 and the blocking layer 8 do not completely coincide with each other, the lattice-mismatching occurring in the side surface of the active layer can be effectively alleviated by setting the average lattice constant of the blocking layer to an intermediate value between those of the InP substrate 1 and the strained quantum well layer 2.

Figure 3:
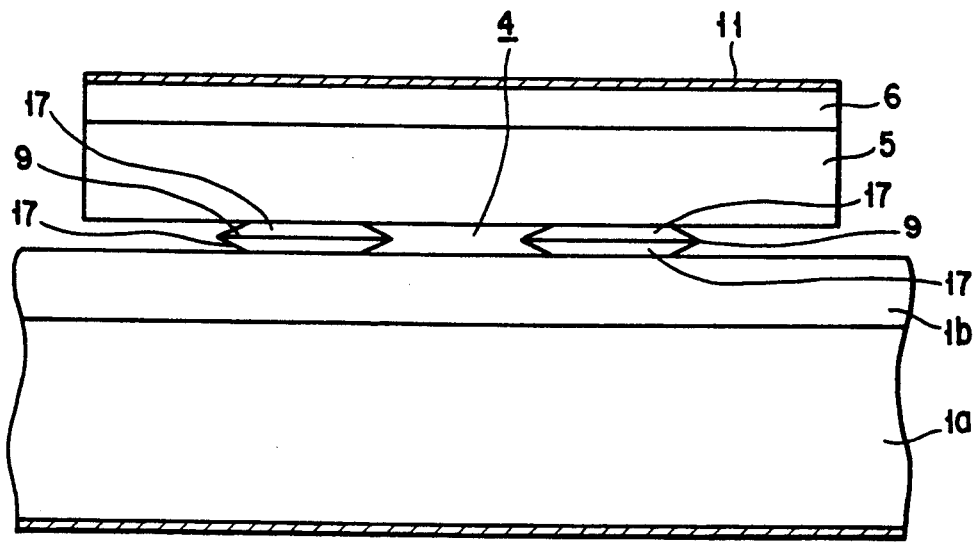
FIG. 3 is a cross sectional view showing the schematic structure of a semiconductor laser according to a second embodiment of this invention.

FIG. 3 is a cross sectional view showing the schematic structure of a semiconductor laser according to a second embodiment of this invention. The construction and the manufacturing process of the semiconductor laser are substantially the same as those of the semiconductor laser of the first embodiment, but this is different from that of the first embodiment in that the strained quantum well layer 2 is formed of $In_{0.48}Ga_{0.52}As$ and a layer 9 of $Ag_{0.65}Cu_{0.35}GaSe_2$ of chalcopyrite structure (tetragonal system) of 1.56 nm thickness is formed in the InP blocking layer 17 instead of the InAlAs layer. The oscillation wavelength is 1.48 $\mu$m which is suitable for optical fiber amplifier excitation.

The lattice constant of the $In_{0.48}Ga_{0.52}As$ strained quantum well layer 2 is 0.58485 nm and is smaller than the lattice constant 0.58688 nm of the InP substrate, unlike the former embodiment. The magnitude of the strain of the strained quantum well layer 2 obtained when it is assumed that the strained quantum well layer 2 infinitely extends is $\epsilon_{xx}=\epsilon_{yy}=0.003471$, $\epsilon_{zz}=-2(C_{12}/C_{11})\epsilon_{xx}=-0.003422$, $\epsilon_{yx}=\epsilon_{zx}=\epsilon_{xy}=0$. In this case, it is assumed that the Poison's ratio of $In_{0.48}Ga_{0.52}As$ is $C_{12}/C_{11}=0.493$. The lattice interval of the strained quantum well layer 2 in the normal direction of the substrate after it is strained is 0.58284 nm. The lattice constant of the $Ag_{0.65}Cu_{0.35}GaSe_2$ layer 9 is a=0.5845 nm and c=1.092 nm, and if the thickness thereof is 1.56 nm and the strain thereof in the direction of axis a is neglected, the microscopic lattice matching with respect to the strained quantum well active layer in the strained state can be attained in the direction of the normal to the substrate. In practice, since the strain of the $Ag_{0.65}Cu_{0.35}GaSe_2$ layer 9 occurs, complete matching cannot be attained unless the composition and thickness thereof are adjusted.

Further, even when the perfect lattice matching is attained for the average of the film thicknesses, microscopic lattice-mismatching may occur in the side surface of the active layer 4. However, even if the lattice matching is imperfect, influence of the lattice-mismatching is dispersed on the entire portion of the tapered portion and the segregation of impurity and lattice defects can be prevented since the side surface of the active layer 4 is formed in a tapered form like the former embodiment. Further, the forbidden bandwidth of the $Ag_{0.65}Cu_{0.35}GaSe_2$ layer 9 is approx. 1.77 eV, which is larger than that of the InP substrate and this is preferable for the current constriction and light confinement. Since various other chalcopyrite materials are present, the degree of freedom of selection can be increased in view of the lattice constant and forbidden bandwidth. Therefore, a high power and highly reliable buried type strained quantum well semiconductor laser can be realized by use of the above method.

This invention is not limited to the above embodiments and various modifications can be made. The barrier layer is not necessarily formed of constant composition but may be formed with the GRIN structure in which the refractive index is decreased (the forbidden bandwidth is increased) continuously or stepwise from the active layer towards the clad layer. The quantum well layer may be a double quantum well structure or double barrier structure. The material of the active layer may be of various combinations including InGaAs, InGaAsP, InGaAlAs, InGaAsSb, GaAlAsSb, GaAlPSb, InAlSb, and InGaAlSb.

The lateral light (and current) confinement structure of the optical waveguide layer may be formed with various structures such as a buried hetero structure and semi-insulative InP buried structure in addition to the above SACM structure. In the case of a semiconductor laser, a distributed feedback type (DFB) laser, distributed Bragg reflector type (DBR) laser, wavelength tunable laser having a plurality of electrodes, complex resonator laser, monitor integrated laser, optical waveguide integrated laser, or bistable laser can be used. Of course, this invention can be applied to various optical semiconductor elements such as a semiconductor optical waveguide, semiconductor light detector (photodiode), semiconductor optical switch, semiconductor directional coupler, semiconductor light modulator, and photonic IC having the above units integrated therein in addition to the above semiconductor laser. In the case of a semiconductor optical waveguide, the stripe is not limited to a straight line, and this invention can be applied to various optical waveguides having side surfaces, such as a bent optical waveguide, a total reflection type optical waveguide, a Y-branch, a cross and a taper The cross sectional taper form is not limited to the tapered form in which the central portion is formed in a concave configuration.

Next, a third embodiment is explained.

Figure 4:
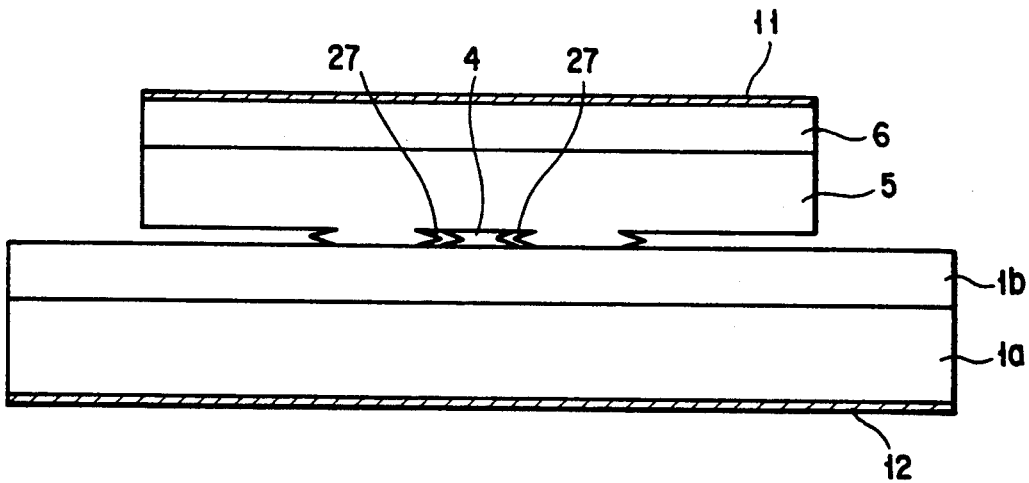
FIG. 4 is a cross sectional view showing the schematic structure of a semiconductor laser according to a third embodiment of this invention.
Figure 5A:
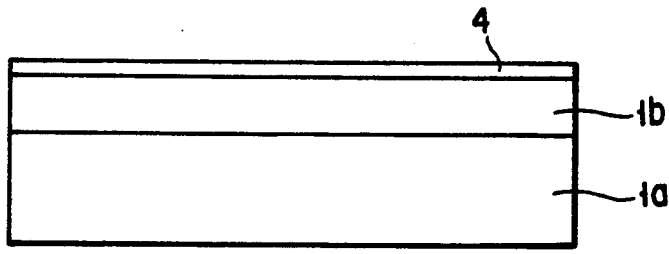
FIGS. 5A to 5D are cross sectional views showing a process of manufacturing the laser according to the third embodiment.
Figure 5B:
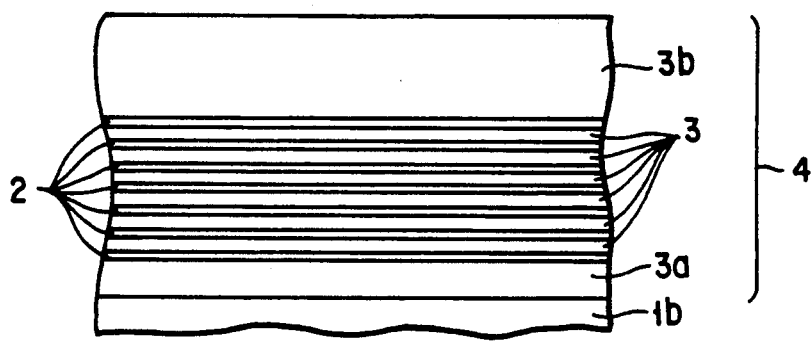

FIG. 4 is a cross sectional view showing the schematic structure of a semiconductor laser according to the third embodiment of this invention FIGS. 5A to 5D are cross sectional views showing the semiconductor laser. The semiconductor laser is manufactured as follows First, as shown in FIG. 5A, an undoped InGaAs-/InGaAsP multiple quantum well active layer 4 is formed over an n-type InP semiconductor substrate 1a having a (001) main surface with an n-type InP buffer layer (clad) 1b of 2 $\mu$m thickness disposed therebetween by the metal organic vapor deposition (MOCVD) method. As shown in FIG. 5B, the active layer is formed with a structure constituted by seven undoped $In_{0.7}Ga_{0.3}As$ strained quantum well layers 2 of 3 nm thickness, and undoped InGaAsP layers 3 (1.2 $\mu$m-wavelength composition) which each have 10 nm thickness (but the lowermost layer 3a is 30 nm thick and the uppermost layer 3b is 100 nm thick), lattice-match with Inp and are respectively disposed on both sides of a corresponding one of the well layers 2.

Figure 5C:
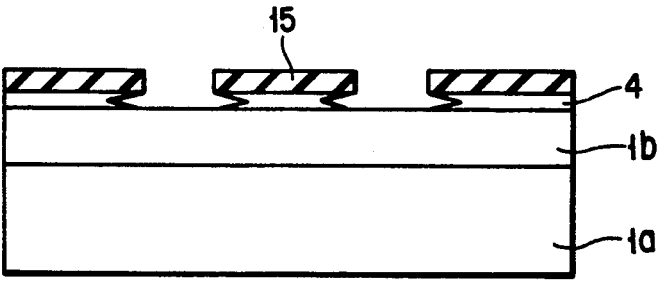

After a diffraction grating is formed on the uppermost InGaAsP layer 3b, an $SiO_2$ film 15 is formed on the diffraction grating and patterned by use of a normal PEP technique to remove the both end portions of the stripe of 2 $\mu$m width serving as an active layer by the width of 1 $\mu$m as shown in FIG. 5C. At this time, if SH series etchant (mixture of sulfuric acid, hydrogen peroxide liquid and water) is used as an etchant for etching the active layer 4, the cross section of an active layer having a recess at the center thereof as shown in FIG. 5C can be obtained. The width of the tapered portion on each side is 0.4 $\mu$m and the width of the active layer at the central portion is 1 $\mu$m.

Figure 5D:
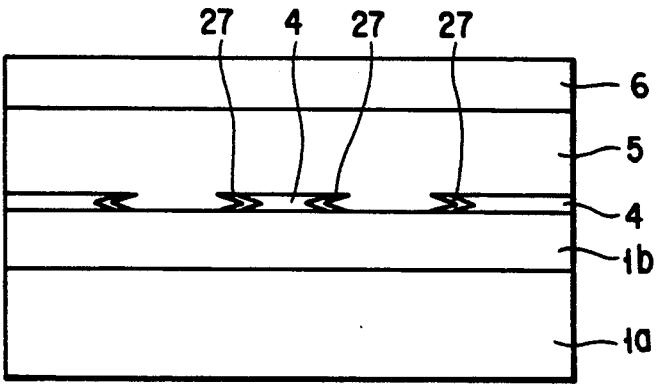

Next, as shown in FIG. 5D, after the $SiO_2$ film 15 is removed, a p-type InP clad layer 5 of 2 $\mu$m thickness having an acceptor concentration of $2 \times 10^{18}$ cm$^{-3}$ and a p-type InGaAsP contact layer 6 of 0.8 $\mu$m thickness are sequentially grown on the entire portion of the resultant structure by the MOCVD method. During the growing process, zinc which is a p-type dopant is diffused from the re-growth interface into the active layer 4. As is well known in the art, if an impurity such as zinc is diffused into semiconductor superlattices, mutual diffusion of Group-III atoms is activated and disordering occurs. As a result, the zinc diffused region in the side surface of the active layer 4 becomes a region of intermediate composition between the compositions of the strained quantum well layer 2 and the no-strain barrier layer 3.

The crystal mixing also occurs in a portion between the p-type InP clad layer 5 and the active layer 4, but since the side surface thereof is tapered, the intermediate composition region of the side surface of the active layer serves as a composition changing region 27 having a composition nearer to the composition of Inp in a portion closer to the outermost end portion thereof. Since the lattice-mismatching of the side surface is distributed in the entire portion of the composition changing region 27, excessive concentration of the stress can be alleviated and generation of defects such as dislocations can be prevented. Further, diffusion of zinc from the upper portion into the active layer 4 can be prevented by the presence of the InGaAsP layer 3b.

After this, a p-type ohmic electrode (Ti/Pt/Au) 11 is formed on the contact layer 6, an n-type ohmic electrode (Au/Ge) 12 is formed on the rear surface of the substrate 1, and the contact layer 6 and p-type clad layer 5 are sequentially and selectively etched to form a mesa structure of 10 $\mu$m width including the active layer 4. Further, the outside active layer is removed by use of SH series etchant to form a semiconductor laser wafer of a self aligned constricted mesa (SACM) structure having a cross section of mushroom form as shown in FIG. 4.

The wafer is cleaved into a bar form of 1 mm length, then cut into chips of 300 $\mu$m width and mounted on a module (not shown). The oscillation wavelength is approx. 1.55 $\mu$m. As described above, since generation of dislocations can be suppressed irrespective of the lattice-mismatching in the side surface of the active layer, a strained quantum well distributed feedback type semiconductor laser having a small threshold value, high power, high speed, low chirping, narrow spectrum line width, and high reliability can be realized.

In this embodiment, diffusion of zinc is effected in the overgrowth step but can be effected in a step independent from the overgrowth step. Further, the diffused impurity is not limited to zinc but may be another impurity such as cadmium, magnesium, beryllium, carbon, or silicon.

Figure 6A:
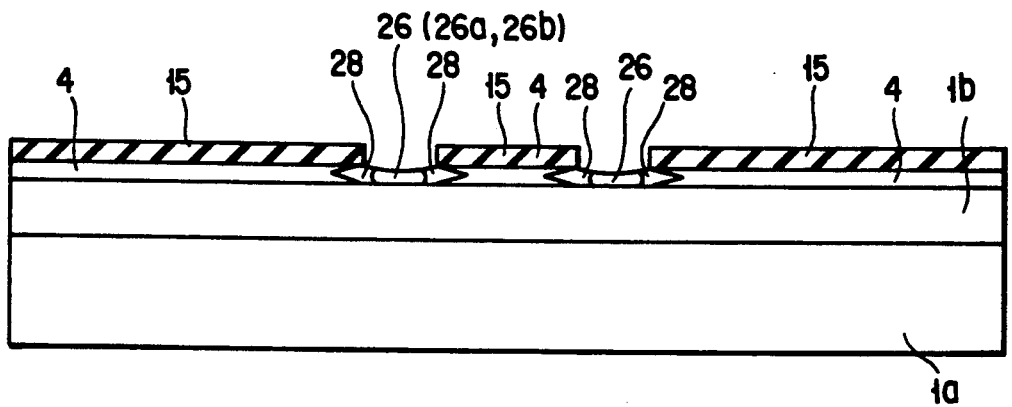
FIGS. 6A and 6B are cross sectional views showing a process of manufacturing a semiconductor laser according to a fourth embodiment.

Next, a method of manufacturing a semiconductor laser according to a fourth embodiment is explained with reference to FIG. 6. The process from the initial crystal growth step to the active layer patterning step is the same as that shown in FIGS. 5A to 5C. After this, as shown in FIG. 6A, a blocking layer 26 of a multi-layered structure having an $In_{0.52}Al_{0.48}As$ layer 26a and an InP layer 26b is selectively grown on a portion in which the active layer has been removed without removing the $SiO_2$ film 15 used for patterning the active layer. The forbidden bandwidth of the blocking layer 26 is larger than that of the active layer 4 so that the leak of current which does not pass the active layer can be prevented.

At this time, since the diffusion length of In is larger than that of Al in a portion on the $SiO_2$ film 15, In of a larger amount than that of Al is excessively supplied to a portion near the $SiO_2$ film 15 at the time of growth of the $In_{0.52}Al_{0.48}As$ layer 26a. As a result, the $In_{0.52}Al_{0.48}As$ layer 26a comes to have a ratio of In/(In+Al) larger than 0.52 in a portion 28 near the $SiO_2$ film 15. Since the ratio In/(In+Al) becomes larger than 0.52 and the lattice constant becomes larger in a portion nearer to the active layer 4, the average lattice constant of the blocking layer 26 becomes nearer to that of the active layer 4. That is, the composition changing region 28 acts to disperse the influence of the lattice-mismatching in the side surface of the active layer in combination with the effect obtained by the tapered side surface. As a result, concentration of the stress can be alleviated and generation of defects such as dislocations can be prevented. The average lattice constant of a portion of the blocking layer 26 near the active layer 4 can be adjusted by changing the crystal growth condition, the thickness and the number of layers of the $In_{0.52}Al_{0.48}As$ layer 26a.

Figure 6B:
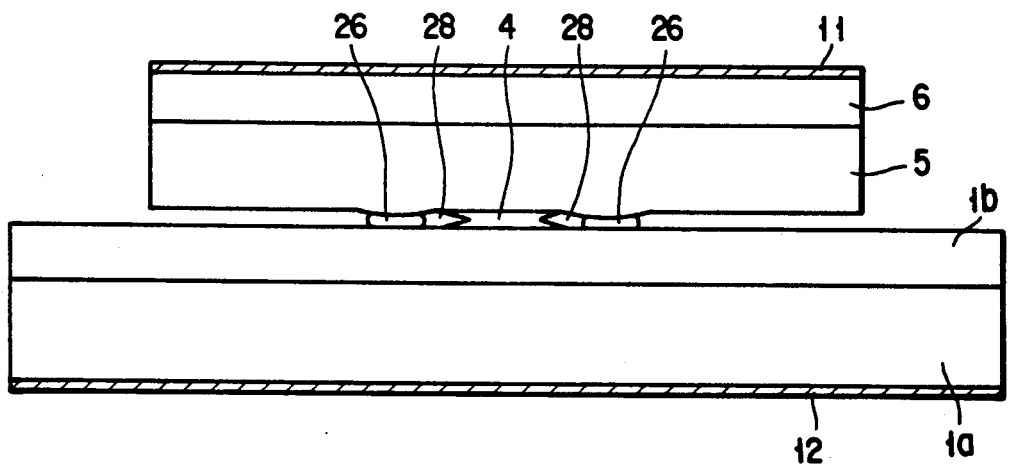

After this, a semiconductor laser as shown in FIG. 6B is completed by removing the $SiO_2$ film 15, forming p-InP clad layer 5 and p-InGaAsP contact layer 6 and forming electrodes and mesa structure like the former embodiment. Also, in this embodiment, generation of defects due to the lattice-mismatching in the side surface of the active layer can be suppressed and a semiconductor laser having a high performance and high reliability can be realized. It is also possible to form the active layer by selective growth after formation of the blocking layer.

Figure 7:
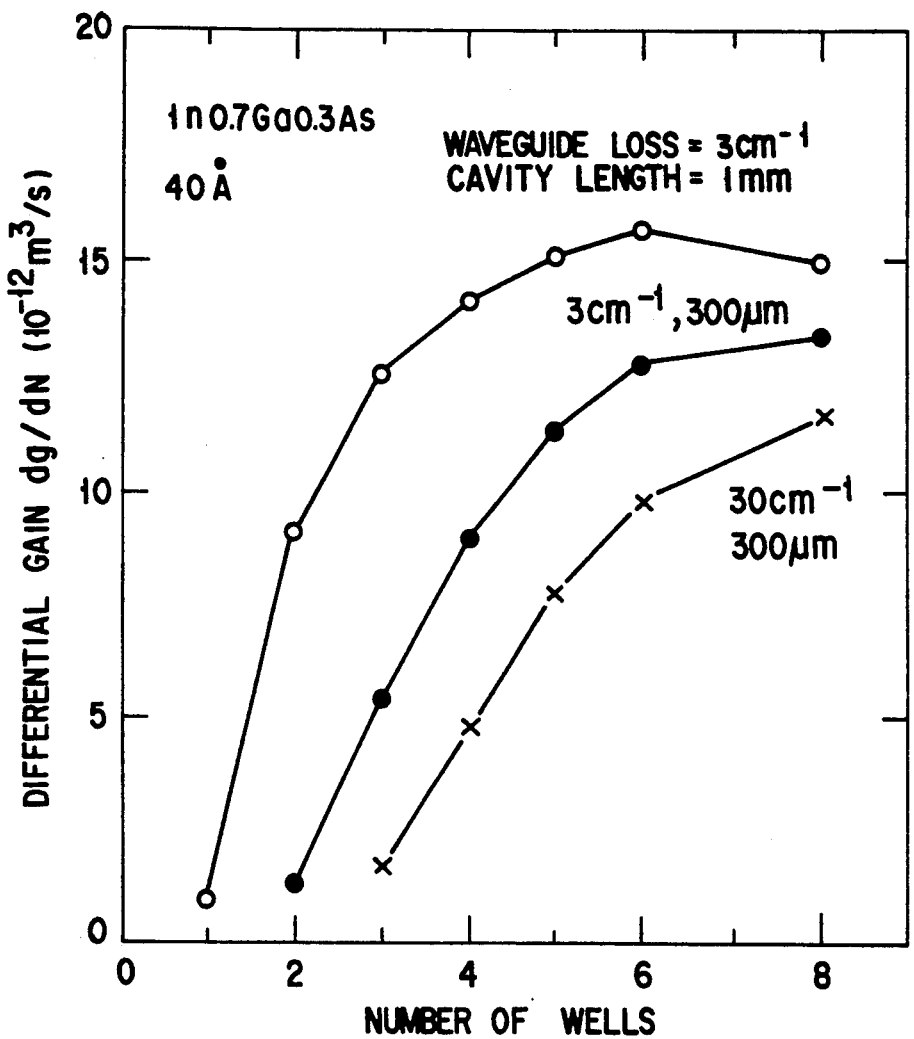
FIG. 7 is a characteristic diagram showing the dependency of the laser differential gain on the number of well layers in the fourth embodiment.

The characteristic of the quantum well laser depends on the number of quantum well layers. FIG. 7 shows examples of calculations for the dependency of the differential gain of the $In_{0.7}Ga_{0.3}As$/InGaAsP-series strained quantum well laser on the number of well layers. In order to attain a good characteristic, it is necessary to provide a certain number of layers. However, unless means for alleviating influence of the lattice-mismatching in the side surface of the active layer is used as in this embodiment, serious dislocations will be generated near the side surface when the number of layers is large (the total film thickness is large). According to the method of this embodiment, the total film thickness can be made larger without generation of dislocations near the side surface of the active layer. A highly reliable semiconductor laser which has a small threshold value, small line width increasing coefficient ($\alpha$ parameter) and large differential gain can be stably attained by use of the structure of this embodiment. The strained quantum well semiconductor laser having the excellent characteristic may be used as a light source in the very high speed optical communication or coherent optical communication, or high power light source for optical amplifier excitation, for example.

This invention is not limited to the above embodiments and various modifications can be made. For example, each semiconductor layer is not necessarily formed of constant composition but may be formed with the GRIN structure in which the refractive index is decreased (the forbidden bandwidth is increased) continuously or stepwise from the active layer towards the clad layer. The lateral light (and current) confinement structure of the optical waveguide layer may be formed with various structures such as a buried hetero structure and semi-insulative InP buried structure in addition to the above SACM structure. The shape of the side surface is not limited to the tapered shape having a recess in the central portion as in the above embodiment, but may be a vertical plane, and the cross section of the active layer may be a trapezoid, inverted trapezoid or any desired form.

In the case of a semiconductor laser, a Fabry-Perot (FP) laser, distributed Bragg reflector type (DBR) laser, wavelength tunable laser having a plurality of electrodes, complex resonator laser, monitor integrated laser, optical waveguide integrated laser, or bistable laser can be used in addition to the distributed feedback type (DFB) laser. Of course, this invention can be applied to various optical semiconductor elements such as a semiconductor laser amplifier, semiconductor optical waveguide, semiconductor light detector (photodiode), semiconductor optical switch, semiconductor directional coupler, semiconductor light modulator and photonic IC having the above units integrated therein and electronic devices such as a pseudomorphic HEMT and hetero junction bipolar transistor in addition to the above semiconductor laser.

The shape of the first region is not limited to the linear stripe, but may be a desired form such as a rectangular, polygon, circle, comb-shape, Y-branch, cross (X), or curve, for example. It will be easily understood that even if the first region is not completely surrounded by another region, if a strained semiconductor layer is also formed in the second region, or if a third region is formed, the effect of this invention can be attained by forming a composition changing region in the side surface of each region including a strained semiconductor layer. The manufacturing method is not limited to the MOCVD method. For example, another method such as the ALE (atomic layer epitaxial growth) method can be used and the order of steps for forming the respective regions can be changed. The material may be of various combinations including SiGe, SiC, ZnSSe, CdSSe, HgCdTe and chalcopyrite in addition to Group-III-V mixed crystal such as InGaAs, GaAlAs, InGaAsP, InGaAlAs, InGaAlP, InGaAsSb, GaAlAsP, GaAlAsSb, GaAlPSb, InAlPSb, InGaAlSb and AlGaN.

Next, a fifth embodiment is explained.

Figure 8:
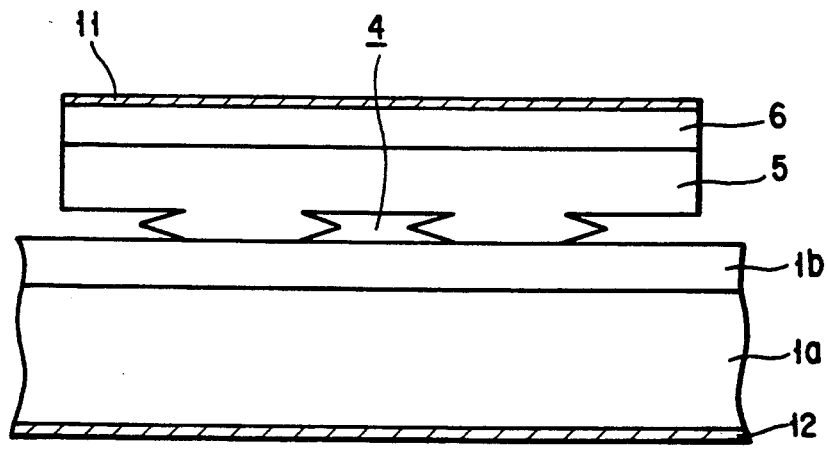
FIG. 8 is a cross sectional view showing the schematic structure of a semiconductor laser according to a fifth embodiment of this invention.

FIG. 8 is a cross sectional view showing the schematic structure of a semiconductor laser according to a fifth embodiment of this invention. The semiconductor laser is formed as follows. An n-type InP buffer layer (clad) 1b of 2 $\mu$m thickness is formed on an n-type InP semiconductor substrate 1a having a (001) main surface by the metal organic chemical vapor deposition (MOCVD) method, then an undoped InGaAs/InGaAsP multiple quantum well active layer 4 is formed on the buffer layer 1b.

Figure 9:
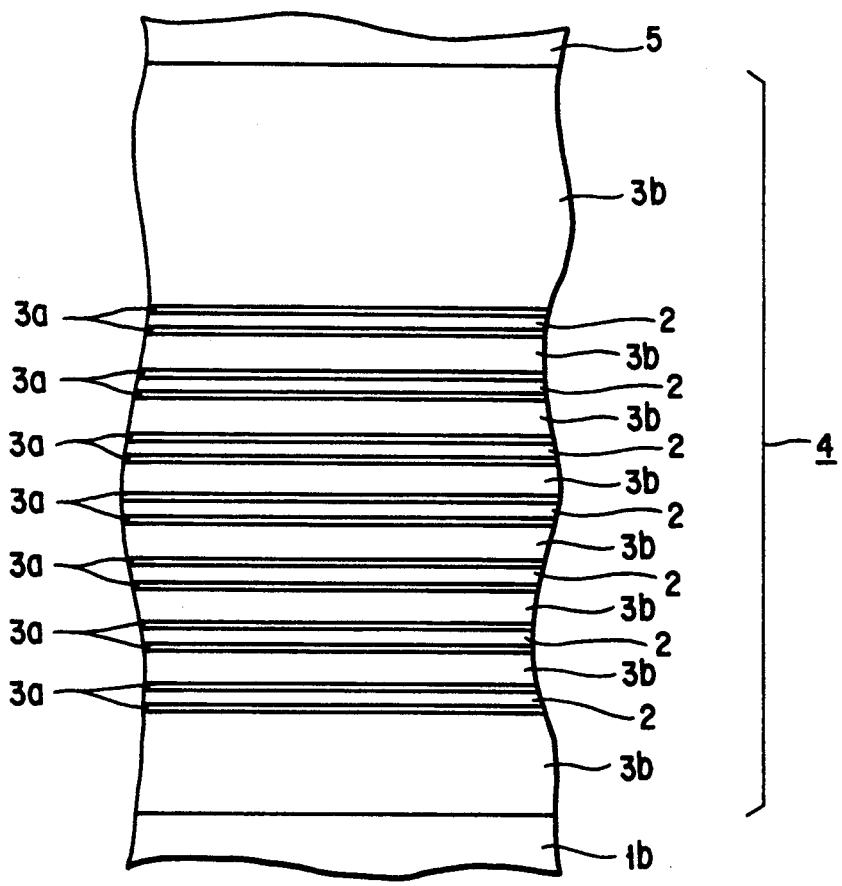
FIG. 9 is a cross sectional view showing the main structure of the laser of the fifth embodiment

As shown in FIG. 9, the active layer 4 is constructed by using seven laminated structures each formed of an undoped $In_{0.7}Ga_{0.3}As$ strained quantum well layer 2 of 4.206 nm thickness and undoped $In_{0.48}Ga_{0.52}As_{0.78}P_{0.22}$ strained barrier layers 3a of 2.005 mn thickness disposed on both sides of the strained quantum well layer 2 and disposing each of the seven laminated structures between a corresponding two of the undoped InGaAsP layers 3b of 1.2 $\mu$m-wavelength composition which lattice-match with InP and each have a thickness of 10 nm (but the lowermost layer has a thickness of 30 nm and the uppermost layer has a thickness of 70 nm). After a diffraction grating is formed on the uppermost InGaAsP layer 3b, an $SiO_2$ is formed thereon and then a patterning process is effected by use of a conventional PEP technique to etch out portions of 1 $\mu$m width on both sides of the stripe of 2 $\mu$m width serving as an active layer. At this time, if SH series etchant (mixture of sulfuric acid, hydrogen peroxide liquid and water) is used as an etchant for etching the active layer 4, the tapered cross section of an active layer having a recess at the center thereof as shown in FIG. 8 can be obtained. The width of the tapered portion on each side is 0.4 $\mu$m and the width of the active layer at the central portion is 1 $\mu$m.

Next, after the $SiO_2$ film is removed, a p-type InP clad layer 5 of 2 $\mu$m thickness and a p-type InGaAsP contact layer 6 of 0.8 $\mu$m thickness are sequentially grown on the resultant structure by the MOCVD method. Then, a p-type ohmic electrode (Ti/Pt/Au) 11 is formed on the contact layer 6 and an n-type ohmic electrode (Au/Ge) 12 is formed on the rear surface of the substrate 1. Next, the contact layer 6 and p-type clad layer 5 are selectively etched to form a mesa structure of 10 $\mu$m width including the active layer 4. Further, the outside active layer 4b is removed by use of SH series etchant to form a semiconductor laser wafer of self aligned constricted mesa (SACM) structure having a cross section of mushroom form as shown in FIG. 8. The wafer is cleaved into a bar form of 1 mm length, then cut into chips of 300 μm width and mounted on a module (not shown). The oscillation wavelength is approx. 1.55 μm.

The lattice constant of the InP substrate 1 is 0.58688 nm, and the lattice constants of the $In_{0.7}Ga_{0.3}As$ strained quantum well layer 2 and the $In_{0.48}Ga_{0.52}As_{0.78}P_{0.22}$ strained barrier layer 3a are respectively 0.59381 nm and 0.57986 nm. Assuming now that there is an infinite plane having no side surface, the strained quantum well layer 2 and the strained barrier layer 3 are as thin as 4.206 nm and 2.005 nm and elastically strained. The degree of strain of the strained quantum well layer 2 is $\epsilon_{xx}=\epsilon_{yy}=-0.01167$, $\epsilon_{zz}=-2(C_{12}/C_{11})x\epsilon_{xx}=0.011974$, $\epsilon_{yz}=\epsilon_{zx}=\epsilon_{xy}=0$. $C_{12}/C_{11}=0.504$ is the Poison's ratio of $In_{0.7}Ga_{0.3}As$.

The degree of strain of the strained barrier layer 3a is $\epsilon_{xx}=\epsilon_{yy}=0.012106$, $\epsilon_{zz}=-2(C_{12}/C_{11})x\epsilon_{xx}=-0.012106$, and $\epsilon_{yz}=\epsilon_{zx}=\epsilon_{xy}=0$. Since, the Poison's ratio of $In_{0.48}Ga_{0.52}As_{0.78}P_{0.22}$ is not exactly derived, it is assumed that $C_{12}/C_{11}=0.5$. As a result, the lattice constant of the strained $In_{0.7}Ga_{0.3}As$ quantum well layer 2 becomes equal to that of InP in the xy plane and the lattice constant in the z direction is 0.60092 nm. The thickness of 4.206 nm corresponds to seven unit lattice layers. The lattice constant of the strained $In_{0.48}Ga_{0.52}As_{0.78}P_{0.22}$ barrier layer 3a becomes equal to that of InP in the xy plane and the lattice constant in the z direction is 0.57284 nm. The thickness of 2.005 nm corresponds to 3.5 unit lattice layers.

Figure 10:
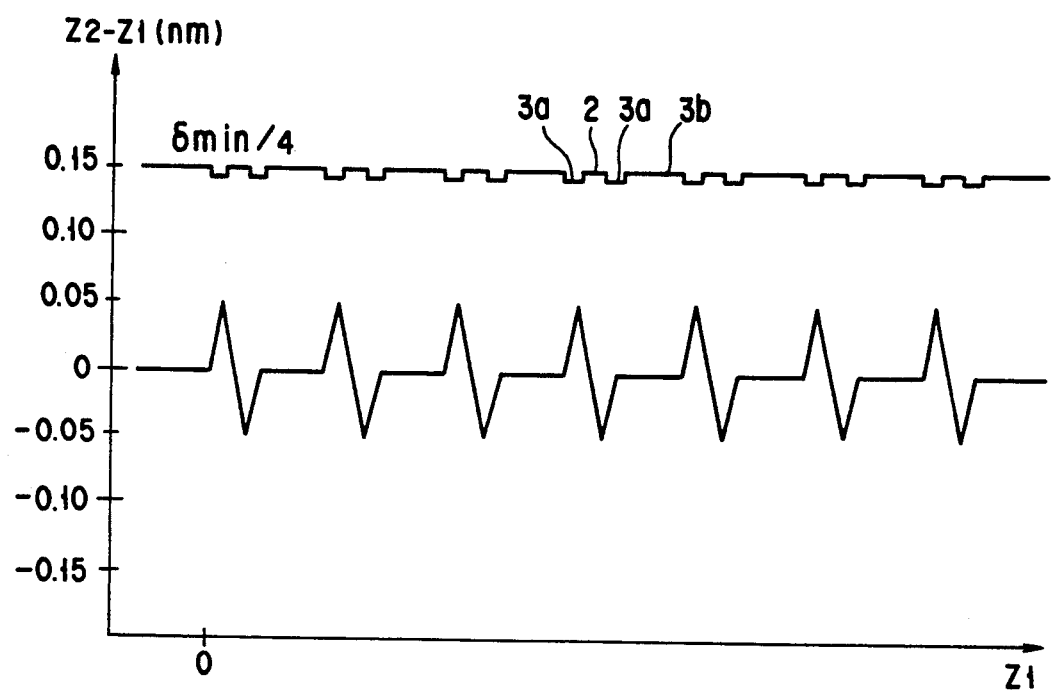
FIG. 10 is a model diagram showing deviation of a lattice plane in the Z direction of the side surface of an active layer in the fifth embodiment.

The degrees of deviation of the lattice plane in the <001> direction and (Z direction) of the side surface of the active layer 4 are shown in FIG. 10. The maximum deviation of the lattice plane is 0.04914 nm and is sufficiently smaller than 0.14321 nm which is ¼ of $\delta_{min}=0.57284$ nm and satisfies the expression (2). Therefore, generation of dislocations caused by deviation in the (001) same group atomic plane accompanied by lateral deviation can be prevented. Of course, since it is difficult to completely control the film thickness and composition by use of the normal MOCVD method which is different from the ALE (atomic layer epitaxial growth), it is considered that a slight variation occurs in the thickness of each strained semiconductor layer.

Further, there is a possibility that the values of the above lattice constant and $C_{12}/C_{11}$ are not precise. However, in either case, if the deviation of the lattice plane in the Z direction of the seven-layered layer can be controlled so as not to exceed 0.28642 nm, that is, so as to satisfy the expression (1), generation of dislocations corresponding to deviation of the unit lattice plane can be prevented. The microscopically small lattice-mismatching occurs in the surface of the active layer 4, but since the side surface of the active layer is formed in a tapered form, the strain and stress are dispersed in the tapered portion and alleviated, and each semiconductor layer can be elastically strained also in the boundary portion of the side surface. Therefore, a buried type strained quantum well laser in which the segregation of impurity and lattice defects such as dislocations in the side surfaces of the strained semiconductor layers 2 and 3a can be prevented and the characteristic and reliability can be kept high can be provided.

The characteristic of the quantum well laser depends on the number of quantum well layers. FIG. 7 shows examples of calculations for the dependency of the differential gain of the $In_{0.7}Ga_{0.3}As/InGaAsP$-series strained quantum well laser on the number of well layers. In order to attain a desired characteristic, it is necessary to provide a certain number of layers. However, unless means for alleviating influence of the lattice-mismatching in the side surface of the active layer is used as in this embodiment, serious dislocations will be generated near the side surface when the number of layers is large (the total film thickness is large). For example, if the $In_{0.48}Ga_{0.52}As_{0.78}P_{0.22}$ barrier layer 3a is omitted in the example of FIG. 8, the accumulated degree of mismatching of the side surface obtained by calculation becomes 0.68796 nm and exceeds the magnitude of the unit lattice layer so that dislocations will occur in the side surface. According to this invention, the total film thickness can be increased without generation of dislocations in the side surface of the active layer.

With the structure of this embodiment, the threshold value can be kept small and an excellent characteristic of the strained quantum well of the linewidth enhancement factor (α parameter) as small as 2 can be stably obtained, and as a result, a semiconductor laser having an excellent characteristic that the chirping (−20 dB average spectrum width) at the time of 10 Gb/s modulation (bias of the threshold value, modulation current 40 $mA_{pp}$) is less than 0.3 nm can be realized. Further, with the semiconductor laser of this invention having the high reliability and small chirping, a several hundred km optical fiber transmission system of 10 Gb/s direct intensity modulation-direct detection system having no external optical modulator can be put into practice.

In a modification of the above embodiment, the barrier layer except the uppermost and lowermost layers may be formed of a single strained InGaAsP layer instead of the multi-layered structure of the strained layers 3a and the non-strained layers 3b. Also, in this case, the same effect can be obtained by setting the composition of the strained InGaAs barrier layer and the thickness thereof in the lattice matching state with respect to the substrate on the xy plane so as to satisfy the expressions (1) and (2).

This invention is not limited to the above embodiment, and can be variously modified as explained in the fourth modification of this invention. It will be easily understood that even if the first region is not completely surrounded by another region, if a strained semiconductor layer is also formed in the second region, or if a third region is formed, the effect of this invention can be attained by setting the amount of deviation, thickness and position of each layer such that the deviation of the lattice plane in the side surface of each region including the strained semiconductor layer may satisfy the expression (1). Further, this invention can be used to alleviate the influence by the lattice-mismatching of the side surface of quantum wires and quantum boxes containing strains.

Next, sixth and seventh embodiments are explained.

Figure 11:
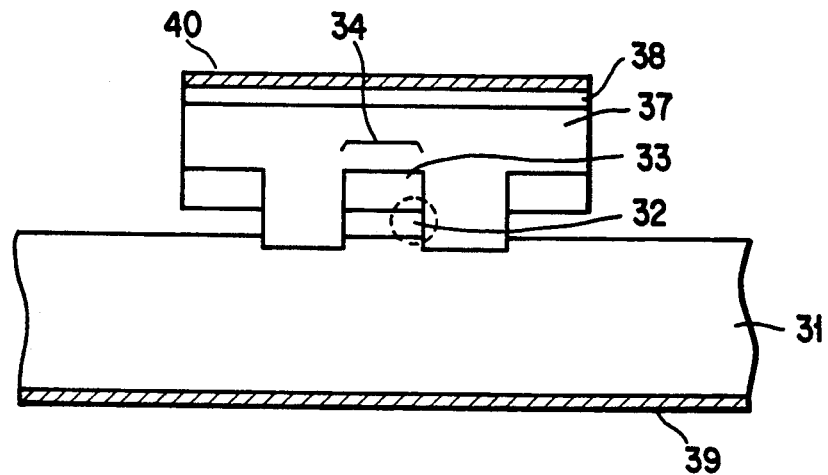
FIG. 11 is a cross sectional view showing the schematic structure of a multiple quantum well semiconductor laser according to a sixth embodiment of this invention.

FIG. 11 is a cross sectional view showing the schematic structure of a multiple quantum well semiconductor laser according to a sixth embodiment of this invention. An active layer 32 of stripe form of 1 μm width is formed on an n-InP substrate 31 and a first p-InP clad layer 33 with an acceptor concentration of $1 \times 10^{17}$ $cm^{-3}$ is formed on the active layer 32.

Figure 12:
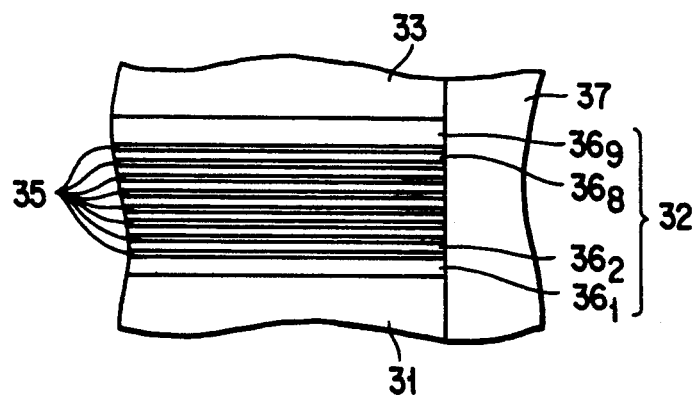
FIG. 12 is a cross sectional view showing an enlarged main structure of the sixth embodiment.

As shown in FIG. 12, the active layer 32 is constructed by eight $In_{0.7}Ga_{0.3}As$ well layers 35 and InGaAsP barrier layers 36 formed of 1.3 μm-wavelength composition which lattice-match with InP and are respectively disposed on both sides of a corresponding one of the well layers. The lowermost layer $36_1$ of the InGaAsP barrier layers 36 has a thickness of 30 nm, the uppermost layer $36_9$ has a thickness of 70 nm, and the other layers $36_2$ to $36_8$ have a thickness of 10 nm. The $In_{0.7}Ga_{0.3}As$ well layer 35 contains compressive strain of approx. 1.16% so that it can be grown to make the atomic interval of the substrate 31 and the in-plane atomic interval to coincide with each other. The thickness of the well layer 35 is 4 nm and is sufficiently smaller than the critical thickness set for preventing generation of dislocations.

A second p-InP clad layer 37 having an acceptor concentration of $1 \times 10^{18}$ cm$^{-3}$ is grown and formed on the p-clad layer 33 to cover the upper and side surfaces of the active layer 34 and p-InGaAsP contact layer 38 is grown and formed on the clad layer 37. Zn is used as p-type dopant in both cases. In order to reduce the parasitic capacitance, the p-clad layer 37 is formed with a constricted mesa structure having a mesa width of 5 μm near the active layer.

An n-type ohmic electrode 39 is formed on the rear surface of the substrate 31, a p-type ohmic electrode 40 is formed on the p-contact layer 38, and a current can be injected into the laser via the electrodes 39 and 40. The cavity length is 1 mm.

Figure 13A:
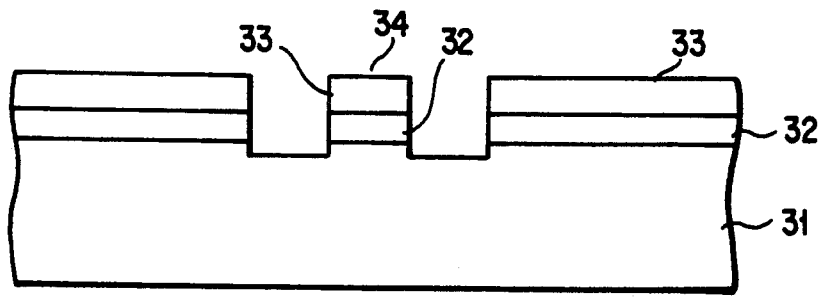
FIGS. 13A to 13C are cross sectional views showing a process of manufacturing the laser of the sixth embodiment.
Figure 13B:
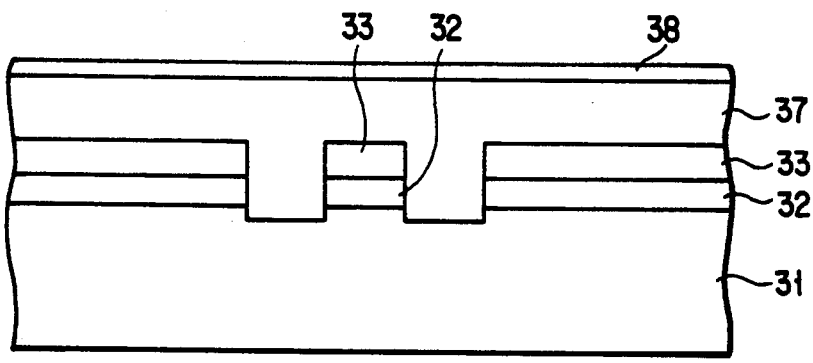
Figure 13C:
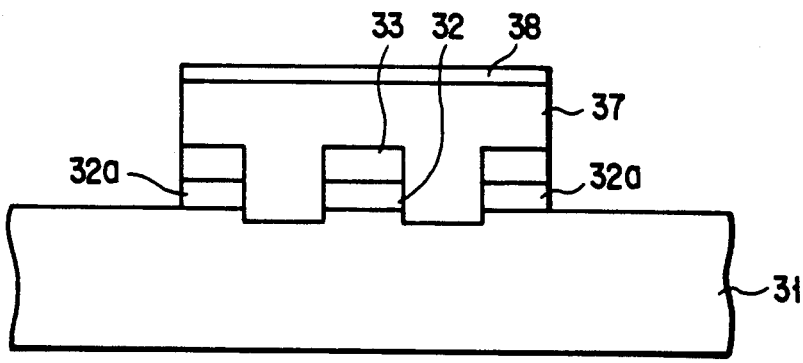

The structure shown in FIG. 11 can be obtained as follows. First, as shown in FIG. 13A, the active layer 32 and p-clad layer 33 are grown on the substrate 31 and selectively etched to form the active area stripe 34. Then, as shown in FIG. 13B, the p-clad layer 37 and p-contact layer 38 are grown. Next, as shown in FIG. 13C, the p-contact layer 38, p-clad layer 37, p-clad layer 33 and active layer 32 are formed into a mesa structure having a mesa width of 10 μm and including the active area stripe 34. After this, the constricted structure shown in FIG. 11 can be obtained by removing the active layer 32a exposed on both sides of the mesa structure.

With the above structure, since the side surface of each well layer 35 of the active layer 32 is formed in contact with the p-InP clad layer 37, holes can be uniformly and efficiently injected into each well layer 35. Holes are also injected into the active layer 32 via the p-clad layer 33, carriers can easily move in the well layer 35 and the width of the active layer is as small as 1 μm so that carrier irregularity in the well layer 35 can be made small. Therefore, the gain saturation due to space hole burning is difficult to occur in the thickness direction and width direction, making it possible to attain a high frequency response with less damping. Further, since the acceptor concentration of the p-clad layer 33 on the active layer 32 is low, the absorption loss of light leaked into the p-clad layer 33 is small. Therefore, the operation can be effected in a region in which the differential gain is high and the oscillation threshold value i small.

Further, the crystal mixing (disordering) of the well layer and the barrier layer tends to occur by diffusion of acceptors in the side surface of the strained quantum well active layer 32 of this embodiment. As a result, the stress caused by the lattice-mismatching in the side surface of the active layer is dispersed into the crystal mixed area and the effect of suppressing generation of dislocations can be expected. Even if dislocations are generated, dislocations may exist in the p-type crystal mixed area which lies between the p-InP clad layer 37 and the active layer 32 or the p-InP clad layer 37 rather than in the internal portion of the active layer 32, and the electron concentration of the corresponding portion is low so that influence directly given to the laser light emission can be considered to be small.

The waveguide loss of the strained multiple quantum well laser of this embodiment was 4 cm$^{-1}$ and the oscillation threshold value was 8 mA. The differential gain was $7.5 \times 10^{-12}$ m$^3$/s and the 3 dB bandwidth was 18 GHz. In the laser in which the acceptor concentration of the p-clad layer 33 on the active layer was $1 \times 10^{18}$ cm$^{-3}$, the waveguide loss was 20 cm$^{-1}$, the oscillation threshold value was 15 mA, the differential gain was $5 \times 10^{-12}$ m$^3$/s and the 3 dB bandwidth was 14 GHz. These laser characteristics are satisfactory. Since the efficiency of hole injection from the side surface of the active layer is high, the threshold value can be reduced without using a complicated structure such as the GRIN structure in the growing process.

In the GRIN strained quantum well laser of the conventional structure in which the side surface portion of the well is directly filled with Fe doped semi-insulative InP, the threshold value was as small as 9 mA, but the differential gain was suppressed to $3.8 \times 10^{-12}$ m$^3$/s. The roll-off structure of low frequency, which is considered to be caused by Fe diffused into the active layer, was observed in the frequency response characteristic, damping was large and the 3 dB bandwidth was only 6 GHz. Further, the crystal growing process for stepwise changing the composition to attain the GRIN structure is complicated in comparison with that for the semiconductor laser of this embodiment.

As described above, according to this embodiment, since the side surface portion of the multiple quantum well active layer 32 is filled with the p-clad layer 37 having a carrier concentration higher than the p-clad layer 33 formed on the active layer 32, holes can be injected from the p-clad layer 37 into the active layer 32, thereby enhancing the injection efficiency and suppressing variation in the hole density between the wells. Therefore, an increase in the differential gain caused by an increase in the injection efficiency, reduction in the threshold value, suppression of the gain saturation for light, and high-speed response can be realized. Further, the number of quantum wells can be increased without degrading the performance and the high power can be effectively obtained.

This invention is not limited to the above embodiments and can be variously modified without departing from the technical scope thereof. For example, this invention can be applied to a DFB laser for very high speed optical communication, multi-electrode wavelength tunable laser, high power laser, and semiconductor laser amplifier. Further, this invention can be applied to a case wherein the barrier of the valence band is high and it is difficult to uniformly inject holes when the other material series is used. In addition, various coatings may be applied to the facet surface or it may be integrated with another element. The effect of this invention is particularly effective when the number of wells is large and the thickness of the barrier layer is relatively large.

Further, this invention can be applied to a multiple quantum wire laser. When the wires are formed in parallel with the width direction of the resonator stripe and formed in multiple i the thickness direction and length direction thereof, the same effect as in the above embodiment can be obtained.

Next, a seventh embodiment of this invention is explained. In this embodiment, the strained quantum well laser is subjected to negative detuning (the oscillation wavelength is set to a wavelength slightly deviated from the gain peak wavelength) to enhance the high-speed response.

Figure 14:
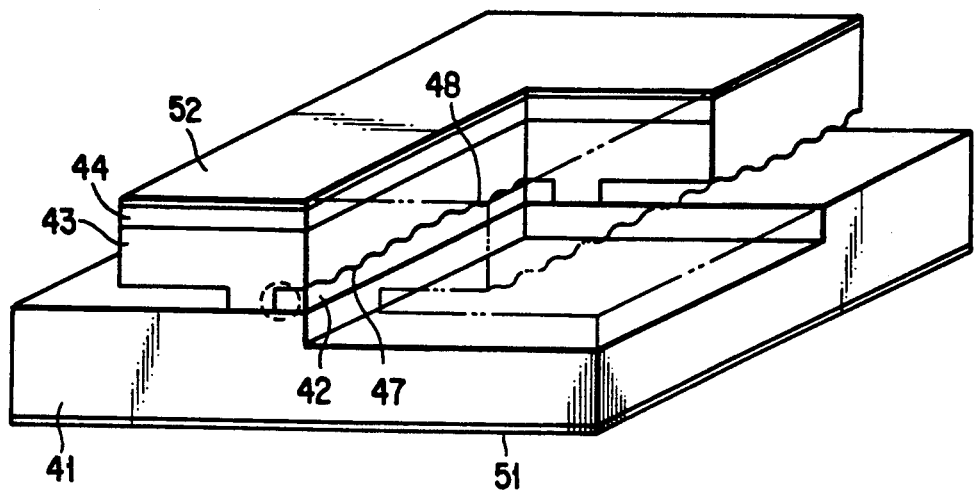
FIG. 14 is a perspective view showing the schematic structure of a semiconductor laser with a portion selectively cut away according to a seventh embodiment of this invention.

FIG. 14 is a perspective view showing the schematic structure of a DFB semiconductor laser with a party cutaway portion according to the seventh embodiment of this invention. A stripe-form active layer 42 is grown and formed on an n-InP substrate 41, a p-InP clad layer 43 is formed on the active layer 42 to cover the upper and side surfaces of the active layer 42 and a p-InGaAsP contact layer 44 is formed on the clad layer 43.

Figure 15:
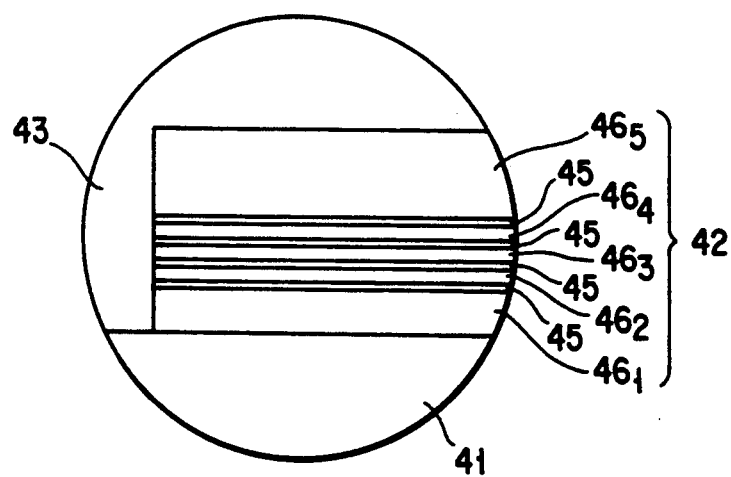
FIG. 15 is a cross sectional view showing an enlarged main structure of the seventh embodiment.

As shown in FIG. 15, the active layer 42 is constituted by four $In_{0.7}Ga_{0.3}As$ well layers 45 and InGaAsP barrier layers 46 formed of 1.3 μm-wavelength composition which lattice-match with InP and are respectively disposed on both sides of a corresponding one of the well layers. The lowermost layer $46_1$ of the InGaAsP barrier layers 46 has a thickness of 30 nm, the uppermost layer $46_5$ has a thickness of 70 nm, and the other layers $46_2$ to $46_4$ have a thickness of 10 nm. The upper-most barrier layer $46_5$ is also used as an optical wave guide and a first order primary diffraction grating 47 with a period of 245 nm is formed on the uppermost barrier layer. The $In_{0.7}Ga_{0.3}As$ well layer 45 contains compressive strain of approx. 1.16% so that it can be grown to make the atomic interval of the substrate 31 and the in-plane atomic interval to coincide with each other. The thickness of the well layer 45 is 4 nm and is sufficiently smaller than the critical thickness set for preventing generation of dislocations. The active layer 42 is not intentionally doped, but since a dopant of Zn is diffused into the active layer when the p-InP clad layer is grown, it is formed as a p-type layer with an impurity concentration of $5 \times 10^{17}$ cm$^{-3}$ to $1 \times 10^{18}$ cm$^{-3}$.

In order to reduce the parasitic capacitance, the p-clad layer 43 is formed with a constricted mesa structure having a mesa width of 5 μm near the active layer. An n-type ohmic electrode 51 is formed on the rear surface of the substrate 41, a p-type ohmic electrode 52 is formed on the p-contact layer 44, and a current can be injected into the laser via the electrodes 51 and 52. The resonator length is 300 μm and a phase shifting region 48 for ¼ wavelength is formed in the central portion of the diffraction grating in the direction of the resonator. A nonreflective coating having a reflectance of less than 1% is formed on the facet surface created by the cleavage.

The oscillation threshold value of the semiconductor laser is 22 mA and it effects a single mode oscillation with the sub-mode suppression ratio of 40 dB in the wavelength of 1.52 μm. The gain peak wavelength for the oscillation threshold value is 1.57 μm and the oscillation wavelength is subjected to negative detuning of 50 nm. In spite of the large degree of negative detuning, rise in the oscillation threshold value is small. With the constricted mesa structure, the time constant determined by the parasitic capacitance and the series-connected resistance is 8 ps which corresponds to the CR frequency bandwidth of 20 GHz.

The relations between an injection current Ib, resonance frequency $f_r$ and damping coefficient γ of the semiconductor laser can be expressed as follows.

$$f_r = (\tfrac{1}{2}\pi)(\xi A/qV_a)^{1/2}(I_b - I_{th})^{\frac{1}{2}} \tag{3}$$

$$\gamma = K f_r^2 + 1/\tau s \tag{4}$$

where ξ is an optical confinement factor, A is a differential gain, q is the charge amount of an electron, $V_a$ is a volume of the active layer, $I_{th}$ is an oscillation threshold value, K is a factor called damping K factor, and τs is a differential carrier lifetime. The K factor is expressed by the sum of a nonlinear term which is proportional to the ratio ε/A of the nonlinear gain ε and the differential gain A and a linear term which is proportional to the photon lifetime τp. The nonlinear term becomes smaller with an increase in A and becomes larger with an increase in ε. The relation between the K factor and the maximum 3 dB bandwidth theoretically determined by the damping is expressed as follows.

$$f_{max} = 2^{3/2}\pi/K \tag{5}$$

Figure 16:
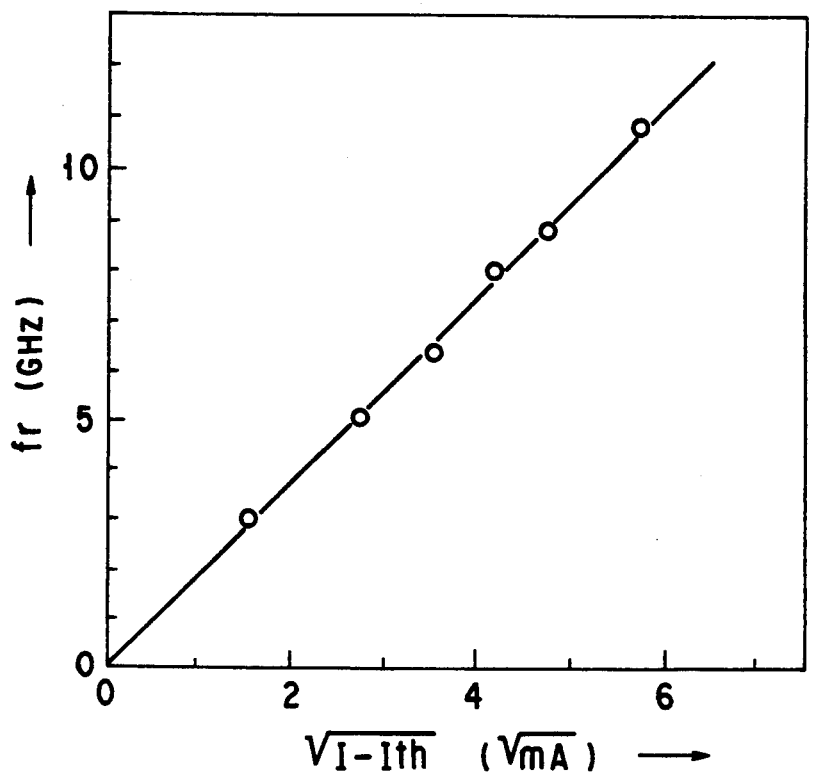
FIG. 16 is a diagram showing the dependency of $f_r$ on $(I_b - I_{th})^{\frac{1}{2}}$ in the seventh embodiment.
Figure 17:
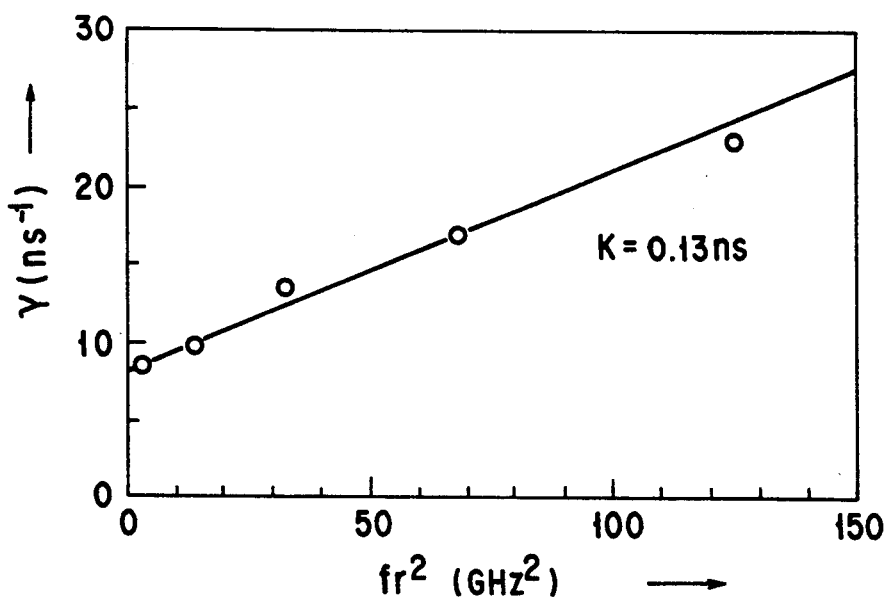
FIG. 17 is a diagram showing the relation between the damping coefficient $\gamma$ and $f_r^2$ in the seventh embodiment.

FIG. 16 shows the dependency of $f_r$ of the semiconductor laser in this embodiment on $(I_b - I_{th})^{\frac{1}{2}}$. The differential gain derived from the equation (3) is $6.8 \times 10^{-12}$ m$^3$/s. FIG. 17 is a diagram showing the relation between γ and $f_r^2$ of the semiconductor laser. The K factor derived from the equation (4) is 0.13 ns. Derived from the equation (5), $f_{max}$ of the laser is 68 GHz. This is attained because the nonlinear gain ε is suppressed to a small value by the detuning and acceptor doping and by an increase in the differential gain obtained by use of the strained quantum well structure. It is safe to say that the degree of negative detuning can be set to such a large value just because the compressive strained quantum well structure having a large band filling effect of the valence band is used. As the optical confinement coefficient ξ is as small as 0.015, the band filling is allowed to be large. Of course, the negative detuning and acceptor doping contribute to an increase in the differential gain.

In the case of this embodiment, it should be additionally noted that reduction in τp due to an increase in the waveguide loss caused by the acceptor doping reduces the linear term and contributes to reduction in the K factor. The actual 3 dB bandwidth is set to 17 GHz by the saturation of output power and roll-off by the CR time constant, but since it can be improved by improving the laser structure, it does not act as an essential limitation factor.

Figure 18:
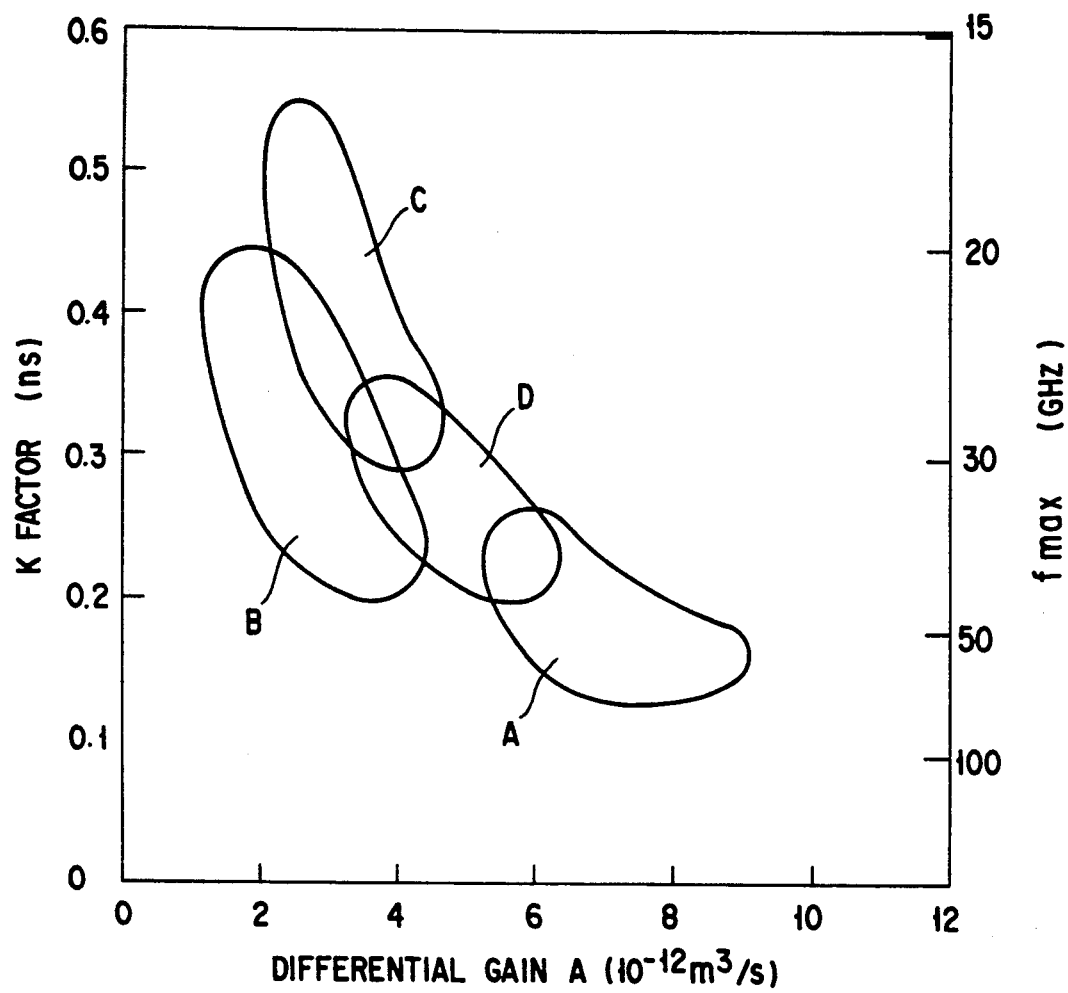
FIG. 18 is a model diagram showing the correlation between the laser differential gain and K factor in the seventh embodiment.

FIG. 18 is a diagram showing the correlation between the differential gain and the K factor. The characteristic (A) of the laser in the embodiment of FIG. 14 is compared with the characteristic (B) of the conventional semiconductor laser, the characteristic (C) of the strained quantum well laser which is not subjected to the negative detuning and doping, and the characteristic (D) of the strained quantum well laser which is subjected to the negative detuning of 20 nm. In the strained quantum well laser, the differential gain can be increased in comparison with that of the conventional semiconductor laser. However, since the nonlinear gain ε becomes larger when the detuning and doping are not effected unlike the embodiment, the K factor becomes larger and $f_{max}$ becomes smaller. In contrast, in the laser of this embodiment, the K factor is not larger than that of the conventional laser, and particularly, it becomes relatively smaller than that of the conventional laser when the detuning of 40 nm is applied, and the very high speed response which cannot be attained by the conventional semiconductor laser can be obtained.

Next, eighth and ninth embodiments are explained.

Figure 19:
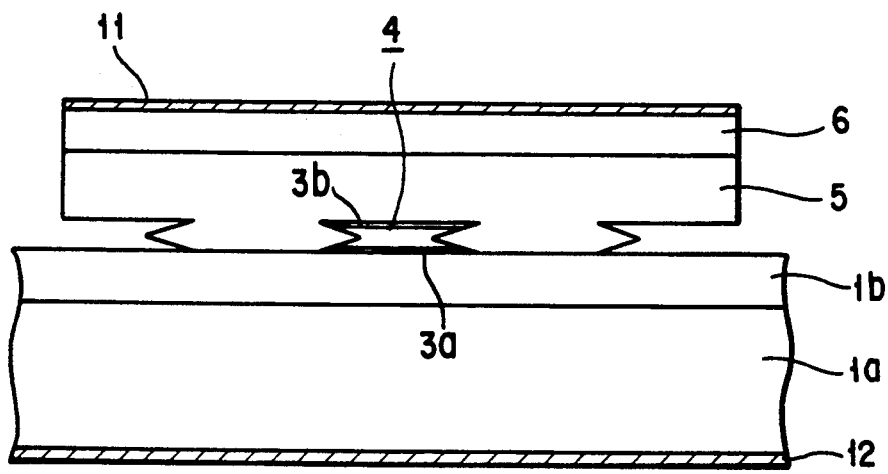
FIG. 19 is a cross sectional view showing the schematic structure of a semiconductor laser according to an eighth embodiment of this invention.
Figure 20:
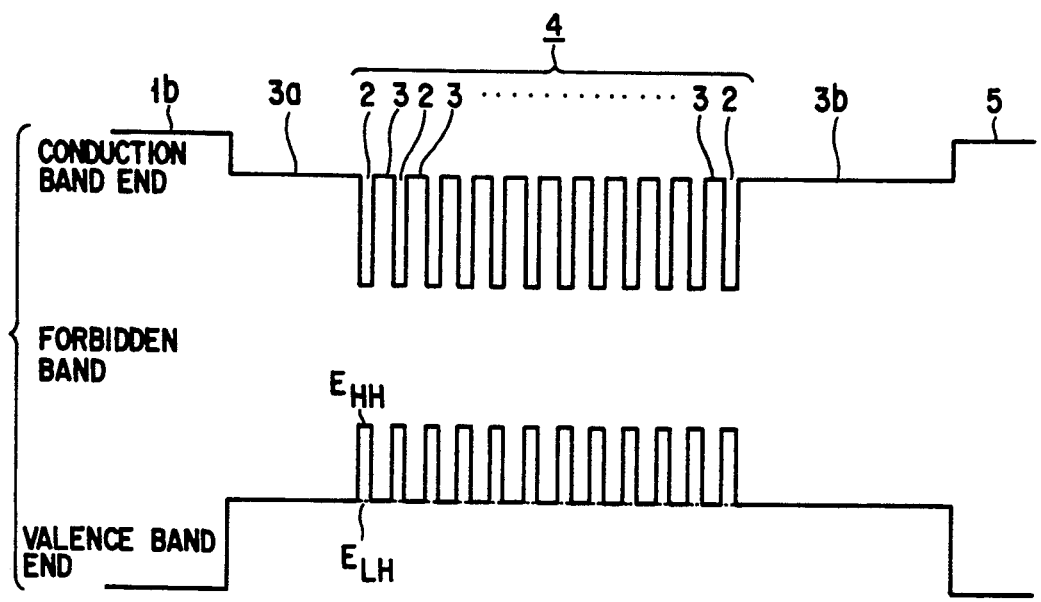
FIG. 20 is a model diagram showing the band structure of an active layer of the laser in the eighth embodiment.

FIG. 19 is a cross sectional view showing the schematic structure of a semiconductor laser according to the eighth embodiment of this invention. The semiconductor laser is manufactured as follows. An n-type InP buffer layer 1b of 2 μm thickness is formed on an n-type InP semiconductor substrate 1a having a (001) main surface by the metal organic chemical vapor deposition (MOCVD) method, then an undoped InGaAsP optical waveguide layer 3a, undoped InAs/InGaAsP multiple quantum well active layer 4 and undoped InGaAsP optical waveguide layer 3b are sequentially laminated on the buffer layer 1b. As shown in FIG. 20, the active layer 4 is constituted by twelve undoped InAs strained quantum well layers 2 of 2 nm thickness and undoped InGaAsP barrier layers 3 of 5 nm thickness each disposed between a corresponding two of the well layers. After a diffraction grating is formed on the InGaAsP optical waveguide layer 3b, an SiO$_2$ film is deposited on the resultant structure and patterned by use of the conventional PEP technique to etch out end both portions of the stripe of 2 μm width serving as the active layer by 1 μm width.

After the SiO$_2$ film is removed, a p-type InP clad layer 5 of 2 μm thickness is formed on the entire portion of the resultant structure and then a p-type InGaAsP contact layer 6 of 0.8 μm is formed on the clad layer 5. A p-type ohmic electrode (Ti/Pt/Au) 11 is formed on the contact layer 6 and an n-type ohmic electrode (Au/Ge) 12 is formed on the rear surface of the substrate 1. The contact layer 6 and the p-type clad layer 5 are selectively etched into a mesa shape of 10 μm width including the active layer 4. Further, the outside portion of the active layer is removed by use of SH series etchant to form a semiconductor laser wafer of a self-alignment constricted mesa (SACM) structure having a cross section of mushroom form as shown in FIG. 19. The wafer is cleaved into a bar form of 1 mm length, then cut into chips of 300 μm width and mounted on a module (not shown).

Assume that the composition of the InGaAsP barrier layer 3 is so selected that the forbidden band end thereof may coincide with the band edge ELH for light holes in the strained InAs layer 2. At present, the band alignment of the $In_{1-u}Ga_uAs_vP_{1-v}$ ($0 \leq u \leq 1$, $0 \leq v \leq 1$) on the InP substrate is not completely known. However, since it is known in the art that the strained InAs layer with InP disposed on both sides thereof forms a shallower quantum well for light holes than that which the In$_{0.53}$Ga$_{0.47}$As layer with InP disposed on both sides thereof forms, it is sure that non-strained $In_{1-x}Ga_x$-As$_y$P$_{1-y}$ composition ($0 < x < 0.47$, $0 < y < 1$) which satisfies the above condition is present.

When the above condition is set, no barrier is created for light holes so that light holes can freely move in the respective well layers 2 and barrier layers 3. Further, light holes are partly coupled with heavy holes in the internal portion of the well layer because the overlapping integral of the wave function for the light holes and heavy holes is not 0. Therefore, holes can be efficiently injected into a well which is far apart from the p-clad layer and the wells can be effectively coupled. As a result, a strained multiple quantum well laser having a small threshold value and high-speed response can be realized.

It is possible to confirm that no barrier is created for light holes by measurement of photoluminescence, for example. That is, light emission by recombination of heavy holes and electrons is permitted only for polarized components parallel to the well layer, but light emission by recombination of light holes and electrons is permitted for polarized components parallel to and perpendicular to the well layer. Therefore, the light emissions can be discriminated from each other and whether the valence band ends $E_{LH}$ for light holes are substantially aligned or not can be determined by checking whether or not light emission by light holes is caused by the quantized level.

Figure 21:
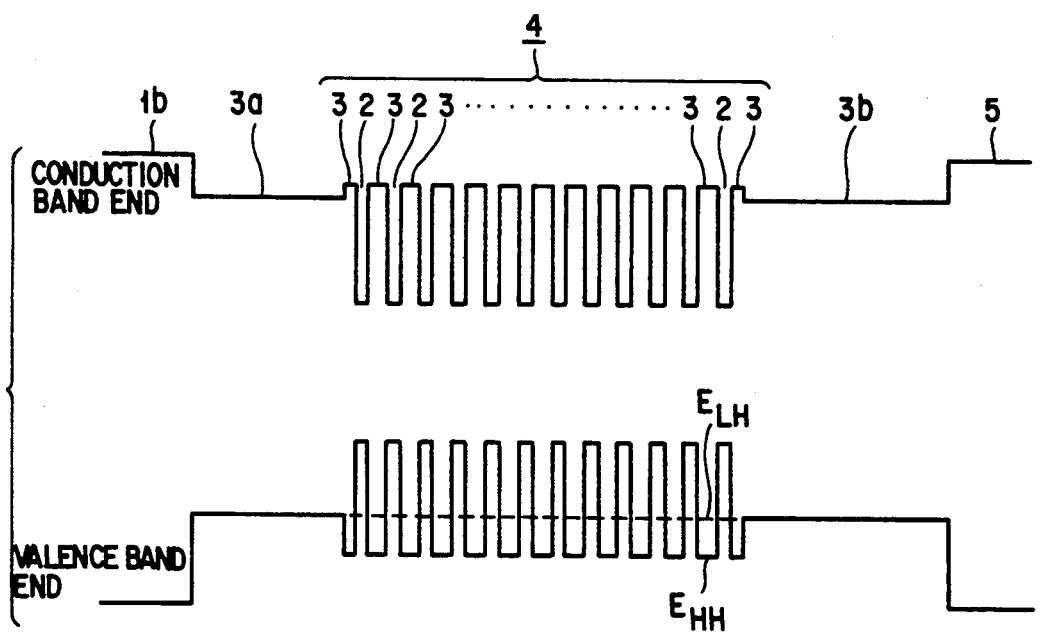
FIG. 21 is a model diagram showing another example of the band structure of an active layer in the eighth embodiment.

This invention is not limited to the above embodiment and can be variously modified. For example, the InGaAsP barrier layer 3 can be formed of material having a lattice constant smaller than that of InP. The conceptional diagram of the band structure obtained at this time is shown in FIG. 21. In this case, since influence of the lattice-mismatching in the side surface can be cancelled by the positive and negative strains in the strained multiple quantum well laser having the active layer buried therein, generation of the lattice defects can be suppressed when the number of laminated layers of the strained well layer is increased.

Figure 22:
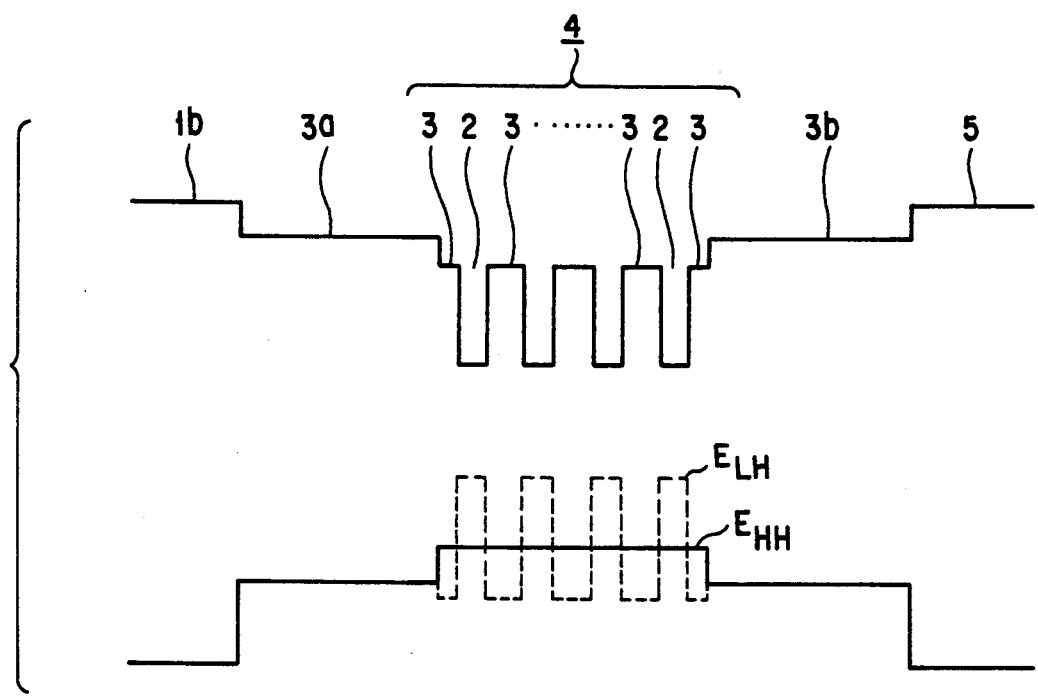
FIG. 22 is a model diagram showing still another example of the band structure of an active layer in the eighth embodiment.
Figure 23B:
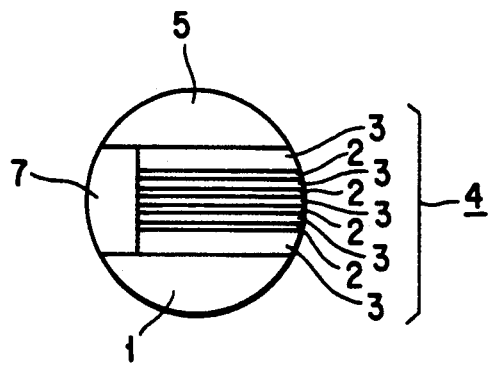
FIGS. 23A and 23B are cross sectional views showing the schematic structure of a conventional multiple quantum well semiconductor laser.
Figure 23A:
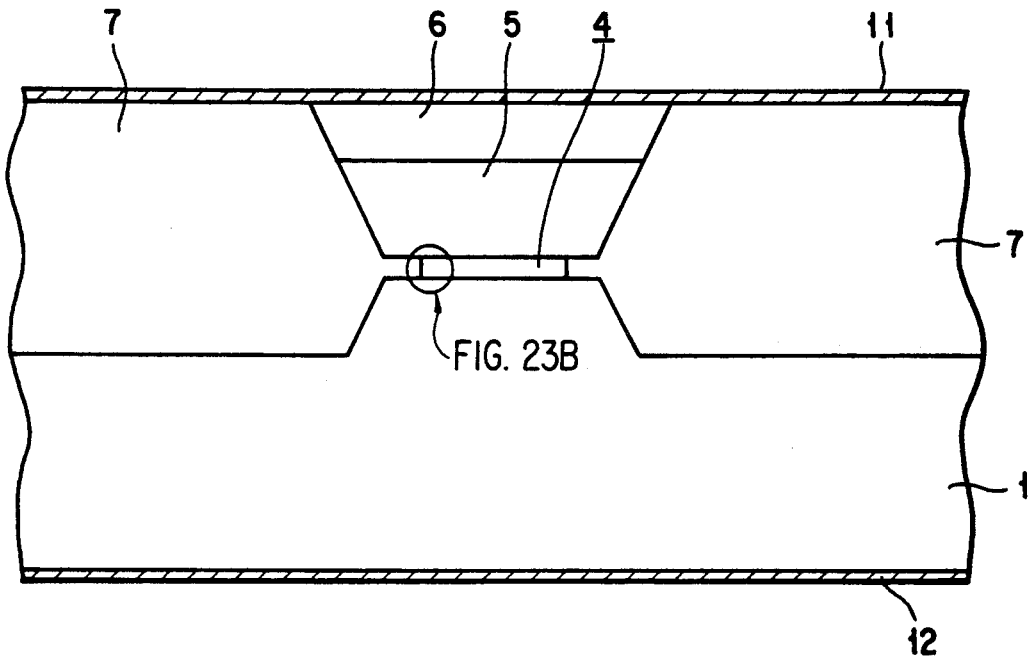

When a semiconductor layer having a lattice constant smaller than that of the substrate is used as a well layer, the hole injection efficiency can be enhanced and the coupling efficiency between the wells can be improved also with respect to the quantum well for light holes by setting the valence band edges $E_{HH}$ for heavy holes in the strained layer and the barrier layer to substantially the constant level. The band structure obtained at this time is shown in FIG. 22.

As the lateral light (and current) confinement structure of the optical waveguide, various structures other than the above SACM structure, for example, buried hetero structure and semi-insulative InP buried structure can be considered. A Fabry-Perot (FP) laser, distributed Bragg reflector type (DBR) laser, wavelength tunable laser having a plurality of electrodes, complex resonator laser, monitor integrated laser, optical waveguide integrated laser, or bistable laser can be used in addition to the distributed feedback type (DFB) laser. Of course, this invention can be applied to various optical semiconductor elements such as a semiconductor laser amplifier, carrier injection type semiconductor optical switch, semiconductor light modulator and photonic IC having the above units integrated therein. Of course, material is not limited to InAs or InGaAsP.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An optical semiconductor device comprising:
    a stripe-form optical waveguide layer formed on a main surface of a semiconductor substrate and having a strained quantum well constituted by first semiconductor layers which each have a thickness of less than the de Broglie wavelength of electrons and which do not lattice-match with said substrate, and second semiconductor layers which each have a forbidden bandwidth larger than that of said first semiconductor layers and which are respectively disposed on both sides of a corresponding one of said first semiconductor layers; and a blocking layer formed of semiconductor having a forbidden bandwidth larger than that of said second semiconductor layer and formed at the sides of said optical waveguide layer;

wherein a non-parallel interface which lies between said blocking layer and said first and second semiconductor layers and which is not parallel to the main surface of said substrate makes an angle of not less than 45 degrees with respect to the normal of said substrate.

2. A device according to claim 1, wherein the average lattice constant of a side region of said blocking layer which is set in contact with said non-parallel side surface takes a value between the lattice constants of said substrate and said first semiconductor layer.

3. A device according to claim 2, wherein the expression that absolute $\{Z2(n)-Z1(n)\} < \delta_{min}(n)/2$ is satisfied when said first and second semiconductor layers are alternately laminated, the lower main surface of the lowermost one of said first semiconductor layers of said optical waveguide layer is used as a reference plane, the coordinate system Z is set in the upward direction along the normal of a low index plane which is the nearest to said reference plane, the coordinate of an n-th unit lattice plane of said optical waveguide layer from said reference plane is $Z1(n)$, the coordinate of an n-th unit lattice plane of said side region from said reference plane is $Z2(n)$, and the smallest one of four values of "$Z2(n+1)-Z2(n)$", "$Z2(n)-Z2(n-1)$", "$Z1(n+1)-Z1(n)$" and "$Z1(n)-Z1(n-1)$" is $\delta_{min}(n)$.

4. A device according to claim 3, which further comprises a compensation semiconductor layer having a forbidden bandwidth larger than that of said first semiconductor layer and in which the sign of a difference between the lattice constant of said compensation semiconductor layer and the average lattice constant of said side region is opposite to the sign of a difference between the lattice constant of said first semiconductor layer and said average lattice constant, and influence of the lattice-mismatching between said first semiconductor layer and said side region is removed by said compensation semiconductor layer.

5. A device according to claim 1, wherein said first and second semiconductor layers respectively serve as quantum well layers and barrier layers and are alternately laminated, and the forbidden band edge of a light hole band in said first semiconductor layer substantially coincides with that of a light hole band in said second semiconductor layer.

6. A device according to claim 1, wherein said first and second semiconductor layers respectively serve as quantum well layers and barrier layers and are alternately laminated, and the forbidden band edge of a heavy hole band in said first semiconductor layer substantially coincides with that of a heavy hole band in said second semiconductor layer.

7. A device according to claim 3, wherein said side region is formed of third and fourth semiconductor layers each having a forbidden bandwidth larger than that of said first semiconductor layer and said third semiconductor layer has substantially the same lattice constant as said first semiconductor layer and is formed in substantially the same plane as said first semiconductor layer.

8. A device according to claim 2, further comprising a composition changing region which is formed adjacent to said non-parallel interface and whose average lattice constant is changed continuously or stepwise between that of said side region and that of said optical waveguide layer.

9. An optical semiconductor device comprising:

a stripe-form optical waveguide layer formed on a main surface of a semiconductor substrate and having a strained quantum well constituted by first semiconductor layers which each have a thickness of less than the de Broglie wavelength of electrons and which do not lattice-match with said substrate, and second semiconductor layers which each have a forbidden bandwidth larger than that of said first semiconductor layers and which are respectively disposed on both sides of a corresponding one of said first semiconductor layers; and a blocking layer formed of semiconductor having a forbidden bandwidth larger than that of said second semiconductor layer and formed at the sides of said optical waveguide layer;

wherein the average lattice constant of a side region of said blocking layer which is adjacent to a non-parallel interface which lies between said blocking layer and said first and second semiconductor layers and which is not parallel to the main surface of said substrate has a value between the lattice constants of said substrate and said first semiconductor layer.

10. A device according to claim 9, wherein said side region includes a semiconductor layer of tetragonal structure having a c axis set in the direction of the normal to said substrate and the lattice constant of the a axis of said semiconductor layer of the tetragonal structure is smaller than that of said substrate.

11. A device according to claim 9, wherein the expression that absolute $\{(Z2(n)-Z1(n)\} < \delta_{min}(n)/2$ is satisfied when said first and second semiconductor layers are alternately laminated, the lower main surface of the lowermost one of said first semiconductor layers of said optical waveguide layer is used as a reference plane, the coordinate system Z is set in the upward direction along the normal of a low index plane which is the nearest to said reference plane, the coordinate of an n-th unit lattice plane of said optical waveguide layer from said reference plane is $Z1(n)$, the coordinate of an n-th unit lattice plane of said side region from said reference plane is $Z2(n)$, and the smallest one of four values of "$Z2(n+1)-Z2(n)$", "$Z2(n)-Z2(n-1)$", "$Z1(n+1)-Z1(n)$" and "$Z1(n)-Z1(n-1)$" is $\delta_{min}(n)$.

12. A device according to claim 11, which further comprises a compensation semiconductor layer having a forbidden bandwidth larger than that of said first semiconductor layer and in which the sign of a difference between the lattice constant of said compensation semiconductor layer and the average lattice constant of said side region is opposite to the sign of a difference between the lattice constant of said first semiconductor layer and said average lattice constant, and influence of the lattice-mismatching between said first semiconductor layer and said side region is removed by said compensation semiconductor layer.

13. A device according to claim 9, wherein said first and second semiconductor layers respectively serve as quantum well layers and barrier layers and are alternately laminated, and the forbidden band edge of a light hole band in said first semiconductor layer substantially coincides with that of a light hole band in said second semiconductor layer.

14. A device according to claim 9, wherein said first and second semiconductor layers respectively serve as quantum well layers and barrier layers and are alternately laminated, and the forbidden band edge of a heavy hole band in said first semiconductor layer substantially coincides with that of a heavy hole band in said second semiconductor layer.

15. A device according to claim 11, wherein said side region is formed of third and fourth semiconductor layers each having a forbidden bandwidth larger than that of said first semiconductor layer and said third semiconductor layer has substantially the same lattice constant as said first semiconductor layer and is formed in substantially the same plane as said first semiconductor layer.

16. A device according to claim 9, further comprising a composition changing region which is formed adjacent to said non-parallel interface and whose average lattice constant is changed continuously or stepwise between that of said side region and that of said optical waveguide layer.

17. An optical semiconductor device comprising:
a stripe-form optical waveguide layer formed on a main surface of a semiconductor substrate and having a strained quantum well constituted by first semiconductor layers which each have a thickness of less than the de Broglie wavelength of electrons and which do not lattice-match with said substrate, and second semiconductor layers which each have a forbidden bandwidth larger than that of said first semiconductor layers and which are respectively disposed on both sides of a corresponding one of said first semiconductor layers; and a blocking layer formed of semiconductor having a forbidden bandwidth larger than that of said second semiconductor layer and formed at the sides of said optical waveguide layer;

wherein a composition changing region whose average lattice constant is changed continuously or stepwise between that of said optical waveguide layer and that of said blocking layer is formed in a boundary portion between said optical waveguide layer and said blocking layer.

18. A device according to claim 17, wherein said blocking layer includes a first p-type region which lattice-matches with the main surface of said waveguide layer and a second p-type region having an acceptor concentration higher than that of said first p-type region and formed on the side surface of said waveguide layer.

19. A device according to claim 18, wherein the acceptor concentration of said first p-type region is set to be not more than $2 \times 10^{17}$ cm$^{-3}$ and that of said second p-type region is set to be not less than $1 \times 10^{18}$ cm$^{-3}$ in the range of 0.25 μm from said waveguide layer.

20. A device according to claim 18, wherein said first semiconductor layer is formed of $In_xGa_{1-x}As$ ($0.53 < x \leq 1$).

* * * * *